US006543045B2

United States Patent
Ludwig et al.

(10) Patent No.: US 6,543,045 B2
(45) Date of Patent: Apr. 1, 2003

(54) METHOD FOR DETECTING AND AUTOMATICALLY ELIMINATING PHASE CONFLICTS ON ALTERNATING PHASE MASKS

(75) Inventors: Burkhard Ludwig, München (DE); Molela Moukara, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/978,396

(22) Filed: Oct. 16, 2001

(65) Prior Publication Data

US 2002/0046392 A1 Apr. 18, 2002

(30) Foreign Application Priority Data

Oct. 16, 2000 (DE) .......................................... 100 51 134

(51) Int. Cl.$^7$ ............................................... G06F 17/50
(52) U.S. Cl. ............................ 716/21; 716/21; 716/19; 716/20
(58) Field of Search .............................. 716/19, 20, 21, 716/28; 430/5, 6; 395/577, 578

(56) References Cited

U.S. PATENT DOCUMENTS

| 5,537,648 A | | 7/1996 | Liebmann et al. |
| 5,888,678 A | * | 3/1999 | Tzu et al. ....................... 430/5 |
| 5,923,562 A | * | 7/1999 | Liebmann et al. ............. 716/19 |
| 5,923,566 A | | 7/1999 | Galan et al. |
| 6,083,275 A | * | 7/2000 | Heng et al. ..................... 716/19 |
| 6,466,373 B1 | * | 10/2002 | Pforr et al. .................. 359/577 |
| 2002/0083410 A1 | * | 6/2002 | Wu et al. ...................... 716/19 |
| 2002/0086218 A1 | * | 7/2002 | Tejnil .......................... 716/21 |

OTHER PUBLICATIONS

Levenson, Marc D. et al.: "Improving Resolution in Photolithography with a Phase–Shifting Mask", IEEE Transactions on Electron Devices, vol. ED–29, No. 12, Dec. 1982, pp. 1828–1936.
Levenson, Marc D.: "Wavefront Engineering For Photolithography", Physics Today, Jul. 1993, pp. 28–36.
Moniwa, Akemi et al.: "Heuristic Method for Phase–Conflict Minimization in Automatic Phase–Shift Mask Design", Jpn. J. Appl. Phys., vol. 34, 1995, pp. 6584–6589.
Widmann, D. et al.: "Technologie hochintegrierter Schaltungen" [technology of highly integrated circuits], Springer Verlag, Berlin, $2^{nd}$ ed., pp. 134–137, No date.

* cited by examiner

*Primary Examiner*—Vuthe Siek
*Assistant Examiner*—Binh Tat
(74) *Attorney, Agent, or Firm*—Laurence A. Greenberg; Werner H. Stemer; Ralph E. Locher

(57) ABSTRACT

A method for eliminating phase conflicts that occur in the layout of a phase mask in a localized and automated manner. The method includes a first step in which a set of phase conflicts is completely determined exclusively by using the technical requirements of the design. The first step is an optimum starting point for the following second step for automatically handling and eliminating such conflicts.

6 Claims, 17 Drawing Sheets

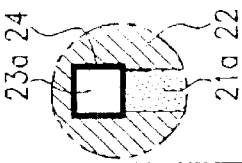
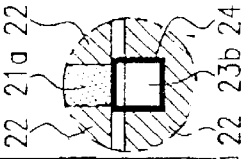
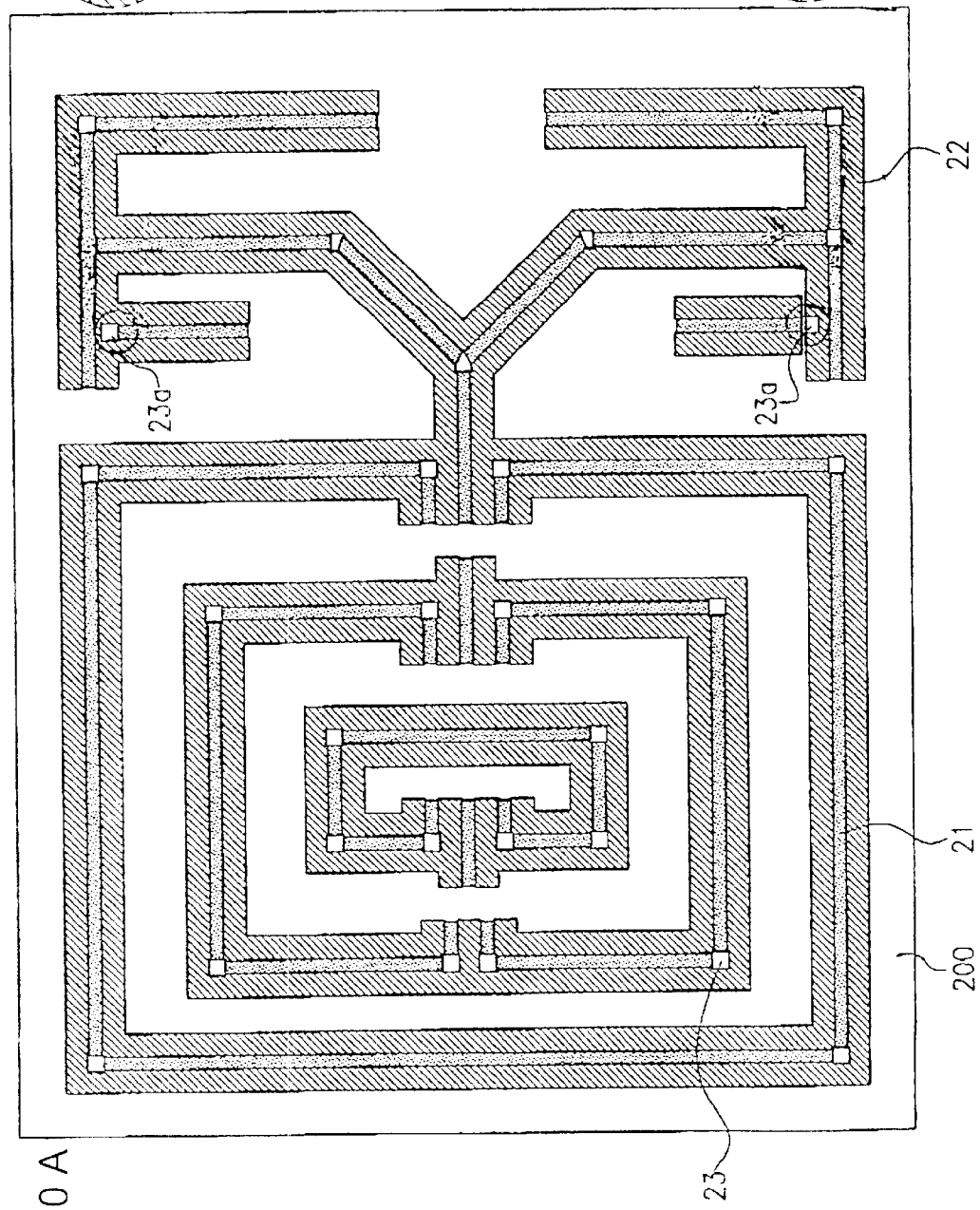
FIG. 10 A
FIG. 10 B
FIG. 10 C

METHOD FOR DETECTING AND AUTOMATICALLY ELIMINATING PHASE CONFLICTS ON ALTERNATING PHASE MASKS

BACKGROUND OF THE INVENTION

FIELD OF THE INVENTION

The invention, in general, relates to the field of the manufacturing integrated semiconductor circuits such as VLSI and ULSI circuits using photolithographic methods. In particular, the invention relates to increasing the resolution of conventional photolithography by using alternating phase masks.

When integrated semiconductor circuits are manufactured, the mask structures that are assigned to the circuit elements are conventionally optically imaged on light-sensitive layers on the wafer. Because of reflective effects, the resolution of such an imaging system is limited and mask structures with dimensions below the reciprocal value of this resolution, also referred to as critical structures, are imaged in a smeared fashion or are out of focus. This leads to undesired strong correlations between the circuit elements and this causes the functionality of the circuits to be impaired.

These difficulties can be overcome by utilizing the destructive interference effect of two directly adjacent and coherent light beams with phases which are shifted through 180°, and by converting the conventional masks in question into alternating phase masks in which each critical structure is provided with two phase shifters for generating the necessary phase shift.

Various types of phase masks are described, for example, in the book "Technologie hochintegrierter Schaltungen" [Technology of highly integrated circuits] by D. Widmann, H. Mader and H. Friedrich, 2nd edition, Springer-Verlag [publishing house], pages 135 et seq. A detailed summary of phase mask technology is given in the publications "Improving Resolution in Photolithography with a Phase-Shifting Mask" by M. D. Levenson et al. in IEEE Trans. Electron. Devices 29 (1982), pages 1828 et seq. and "Wavefront Engineering for Photolithography" by M. D. Levenson in Physics Today, July 1993, pages 28 et seq.

The use of what are referred to as strong phase masks, which include both the alternating phase masks already mentioned and chromium-free phase masks, requires the transparent phase-shifting structures in each affected plane to be assigned to one of two phases which have a phase difference $\Delta\phi=180°$. Here, the following two cases must be distinguished: in what is referred to as a dark-field phase mask, transparent structures correspond to the circuit elements (for example conductor tracks) and phases can be assigned to them, while non-transparent mask fields are formed by regions covered with chromium. In contrast, in what is referred to as a bright-field phase mask, the non-transparent regions of the phase mask, which are covered with chromium and which constitute the circuit elements, and the regions lying between them are transparent. In the latter case, suitable regions in the vicinity of the non-transparent chromium regions must be defined as phase-shifting elements. The phase-shifting elements are produced in accordance with specific design rules, known per se in the prior art. The method of production is described, for example, in U.S. Pat. No. 5,537,648, which is incorporated herein by reference.

In view of the complexity of modern circuits and the requirement for two phase-shifting elements which are displaced by 180° on each critical structure, it is, however, conceivable that there will be phase conflicts. A phase conflict occurs precisely if the same phase is incorrectly assigned to the phase shifters on both sides of a critical structure or if, because of the interaction of the phase-shifting elements, the destructive interference effect occurs at an undesired point on the aforementioned light-sensitive layer. The phase assignment for the various phase-shifting elements thus constitutes a mathematical combinatorial problem which cannot be generally solved. Because the phase assignment can in principle lead to different results and different phase assignments can take place for one and the same cell of a hierarchical layout, the phase assignment must be performed last on the finished circuit layout in an automated program. For this reason, there is a need for an automated checking routine that examines a circuit layout to determine whether phase assignment is at all possible. This checking should be complete and should restrict the problem as satisfactorily as possible, i.e. should determine its actual place of origin. The latter is not self-evident; it is due to the fact that if the combinatorial function "does not go", this is possible in various ways and the point at which it is discovered that this is the case can lie far from the actual place of origin.

After phase conflicts have been determined in an automated routine, they can be resolved in basically two different ways. First, the circuit design can be slightly changed at the points of localized phase conflicts, for example, by shifting conductor track structures so that the phase conflicts are eliminated. On the basis of this changed circuit design, a successful phase assignment can then be carried out in order to generate a phase mask. Second, the circuit design can remain unchanged and instead the phase conflicts can be resolved by assigning two different phases to individual phase-shifted elements. However, the result of this is that a dark line occurs in the exposure on the boundary between the two different phase regions, which would lead to an interruption. For this reason, in this case an additional exposure step is carried out with what is referred to as a trim mask which is used for specially exposing the dark lines which occur.

In the prior art, two different methods are known for checking a layout for phase conflicts. The publication "Heuristic Method for Phase-Conflict Minimization in Automatic Phase-Shift Mask Design" by A. Moniwa et al. in Jpn. J. Appl. Phys., Vol. 34 (1995), pp. 6584–6589, discloses an access method based on graph theory in which a set of phase-shifting elements are postulated and a planar, non-directed graph is formed from this set taking into account the technological requirements. In this method based on graph theory, graph nodes (vertices) constitute phase-shifting elements. A graph edge between two nodes means that the region between the associated phase shifters is lithographically critical. In this method phase conflicts are manifested as those cycles with an uneven number of vertices. Because of the significance of the graph edges, a break in a cycle, i.e. resolution of a phase conflict is equivalent to expanding the corresponding critical region. An efficient conflict resolving strategy in accordance with the aforesaid method should be to break the edges occurring most frequently in the uneven cycles.

U.S. Pat. No. 5,923,566 describes a computer-implemented routine which is used to verify whether an existing circuit design can be imaged onto a phase mask or whether localized phase conflicts are present. The phase conflicts are registered from the interaction between critical circuit regions and the coherent free circuit regions which are to be determined taking into account the technological requirements. Free circuit regions with an uneven number of interactions represent the phase conflicts.

Both methods described above do not, however, operate in an optimum way in registering phase conflicts. First, as is explained below with reference to examples, these two methods prove inefficient because, for example, certain phase conflicts are indicated in duplicate. Second, they prove inadequate because they cannot be used to register other phase conflicts.

Therefore, the phase conflicts cannot be correctly registered by means of the identification methods which are known from the prior art. Consequently, even a conflict elimination method which uses the results of the identification method to eliminate the identified phase conflicts cannot give optimum results.

SUMMARY OF THE INVENTION

It is accordingly an object of the invention to provide a method for detecting possible phase conflicts on alternating phase masks and for automatically eliminating these detected phase conflicts which overcomes the above-mentioned disadvantages of the prior art methods of this general type. In particular, it is an object of the invention to provide such a method having a first step in which, a set of phase conflicts that is present is completely determined in a minimal fashion, and having a second step in which the set of phase conflicts can be eliminated in an automated fashion by exclusively using the technological requirements which are made of the circuit structure. After the elimination of the phase conflicts, a layout for a phase mask can then be generated.

With the foregoing and other objects in view there is provided, in accordance with the invention, a method for detecting possible phase conflicts on alternating phase masks and for automatically eliminating these detected phase conflicts that is applied to a dark-field phase mask, that is to say circuit elements such as electrical conductor tracks are to be imaged onto transparent regions of the phase mask.

In this method:

In a method step a.) critical regions are determined in which in each case two adjacent transparent regions which are provided for the phase mask are less than a specific predefined minimum distance from one another.

In the next method step b.) overlapping regions between straight sections of the critical regions obtained and end regions of straight sections of the critical regions which end in the middle of transparent regions are determined, and critical regions which are degenerated are produced. The latter are obtained by removing overlapping regions from the critical regions.

In a further method step c.) coherent regions (lands) which lie outside the transparent regions and the critical regions are then determined, and large outer borders of the lands and of the overlapping regions and end regions obtained in the preceding method step are determined. Then, in a method step the number of contact lines between each of the specific outer borders and the degenerated critical regions is determined, and a phase conflict is detected if the number is uneven.

Finally, in a method step e) the phase conflicts are resolved in that coherent layout regions and the region borders of the regions are determined, coherent layout regions are defined by the transparent regions and the critical regions which lie between them, minus the end regions and the overlapping regions which represent phase conflicts (A), at least one connecting path is generated between a large outer border which represents a phase conflict and either one directly adjacent region border which lies further out or an uneven number of large outer borders which are not yet connected and which also represent phase conflicts (B), the set of connecting paths generated is then reduced to that in which each phase conflict is contained precisely once (C), those regions (coverage regions) of the connecting paths which lie over the transparent regions are then marked (D) and finally, for the phase mask, the coverage regions are formed as region boundaries between two different regions of the phase mask which is to be manufactured and whose phase shifts have a phase difference of $\Delta\phi=180°$ (E).

With the foregoing and other objects in view there is provided, in accordance with the invention, a method for detecting possible phase conflicts on alternating phase masks and for automatically eliminating these detected phase conflicts that is applied to a bright-field phase mask, that is to say circuit elements such as electrical conductor tracks are to be imaged onto non-transparent regions of the phase mask. In this method:

In a method step a.) phase-shifting regions are determined on each side of n on-transparent critical regions which are provided for the phase mask. Critical regions are defined by the fact that they are less than a predefined structural width.

Then , in a method step b.) overlapping regions between straight sections of the critical regions and end regions of straight sections of the critical regions which end in the middle of phase-shifting regions or interaction regions between phase-shifting regions are determined, and degenerated critical regions are produced. The latter are obtained by removing overlapping regions from the critical regions .

In a method step c.), coherent regions which lie outside the phase-shifting and critical regions are determined, and large external borders of the se lands and of the overlapping regions and end regions obtained in the preceding method step are determined.

Finally, in a method step d.), the number of contact lines between each of the specific outer borders and the degenerated critical regions is determined and a phase conflict is detected if the number is uneven.

In a method step e.) the phase conflicts are then resolved in that coherent layout regions and the region borders (40) of the regions are determined, coherent layout regions are defined by the phase-shifting regions, the critical regions and the interaction regions, minus the end regions and the overlapping regions which represent phase conflicts (A), at least one connecting path being generated between a large outer border which represents a phase conflict and either one directly adjacent region border which lies further out or an uneven number of large outer borders which are not yet connected and which also represent phase conflicts (B), the set of connecting paths generated is then reduced to that in which each phase conflict is contained precisely once (C), those regions (coverage regions) of the connecting paths which lie over the transparent regions are then marked (D), and finally, for the phase mask, the coverage regions are formed as region boundaries between two different regions of the phase mask which is to be manufactured and whose phase shifts have a phase difference of $\Delta\phi=180°$ (E).

Thus, in its first step, the present invention provides a formalism by means of which the possibility of directly connecting integrated semiconductor circuits into alternating phase masks, both dark-field masks and bright-field masks is checked. This is done by means of an explicit localization of the phase conflicts occurring in the respective layout by exclusively using the technological requirements which are made of the design. The set of phase conflicts which is determined using this formalism is complete and minimal, i.e. all the existing phase conflicts are always determined, and existing phase conflicts are not indicated repeatedly, for example.

These phase conflicts are then eliminated by means of the automated method described.

In the method step B., during the elimination of the phase conflicts (e) the connecting paths can be formed in a practical and rapid fashion both with dark-field and bright-field masks, in such a way that firstly pairs of edges, lying opposite one another, of in each case one large outer border and one directly adjacent region border, lying further out, are determined and then at least one connecting path is generated between the edges of each pair. However, because the connecting paths must later lead to phase jumps in the phase-shifting regions, only the following edges have to be taken into account in the group-based resolution of the associated adjacent position problem:

1) all the edges of the large outer contour of the respective layout group,
2) all the edges of the polygons which represent phase conflicts and from which the contact lines are to be removed.

However, the connecting paths do not necessarily run between edges of pairs of the large outer borders and of the layout group borders. Furthermore, a connecting path between two phase conflicts or between a phase conflict and the outer contour of a layout group does not necessarily need to be straight; it can instead run through lands with an even number of contact lines (that is to say no phase conflicts) and assume a very complicated shape. Its essential feature is that it connects a phase conflict either to the outer contour of a layout group or to an uneven number of the remaining phase conflicts which are not yet connected.

After the connecting paths have been generated, they are reduced in the method step D to a set of connecting paths in which each phase conflict occurs only once. For the inventive elimination of the phase conflicts it is thus sufficient to retain in each case just one connecting path between two phase conflicts or one phase conflict and the outer contour of its layout group after the reduction.

Preferably, specific technological requirements, for example the width of trim openings, continue to be predefined, the requirements being used as the basis on which a number of connecting paths which are firstly generated are also subsequently recognized as being invalid. As a result of this, there may still be phase conflicts without connecting paths because of the reduction and the invalidity after the method steps have been run through. In this case, in a second step, further adjacent elements, i.e. further external large outer borders or adjacent phase conflicts are taken into account. If there are still phase conflicts without connecting paths after this iteration, it is necessary to distort the layout in order to eliminate the respective critical structure, or a multiple exposure technique with phase masks as trim masks is necessary. Such a distortion or generation of the necessary trim masks can readily be automated on the basis of the uniquely defined localization of the phase conflicts which took place in the first part of the method according to the invention.

The following step in the method according to the invention is for those regions of the connecting paths which lie over the phase-shifting regions to be taken into account or marked in some way. These regions are optimum structures for automatically generating trim masks and for automatically carrying out the multiple-phase mask technique.

In the last step, in order to prepare the manufacture of the phase mask, the coverage regions are embodied as region boundaries between two different regions of the phase mask to be manufactured. For this purpose, for example, the coverage regions can be removed by the phase shifters and the regions of the phase mask to be manufactured can be represented in some suitable way, for example as two different colors of a phase mask which can be colored with two colors.

The connecting paths formed in this method, and thus also the coverage regions are preferably embodied as thin webs. During the projecting imaging of the phase mask, dark, unexposed lines are produced in the coverage regions as a result of—in this case undesired—interference between the adjacent regions which are phase shifted through 180°. In order to subsequently expose these dark lines, it is possible, for example after the method step F.), to manufacture a trim mask which has openings in the coverage regions so that these regions are subsequently exposed on the photoresist to be exposed.

Other features which are considered as characteristic for the invention are set forth in the appended claims.

Although the invention is illustrated and described herein as embodied in a method for detecting and automatically eliminating phase conflicts on alternating phase masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2a shows the dark-field mask shown in FIG. 1a;

FIG. 5a shows a further dark-field mask which has a dual T structure in comparison with FIG. 4a;

FIG. 5b shows the mask structure with additionally illustrated overlapping regions and outer borders;

FIG. 10a shows the bright-field mask from FIG. 9 with additionally illustrated overlapping regions (bright) between straight sections of the non-transparent, critical structural regions;

FIGS. 10b and 10c show enlarged circular details from FIG. 10a for defining the end regions;

DESCRIPTION OF THE PREFERRED EMBODIMENT

Figure 1C:
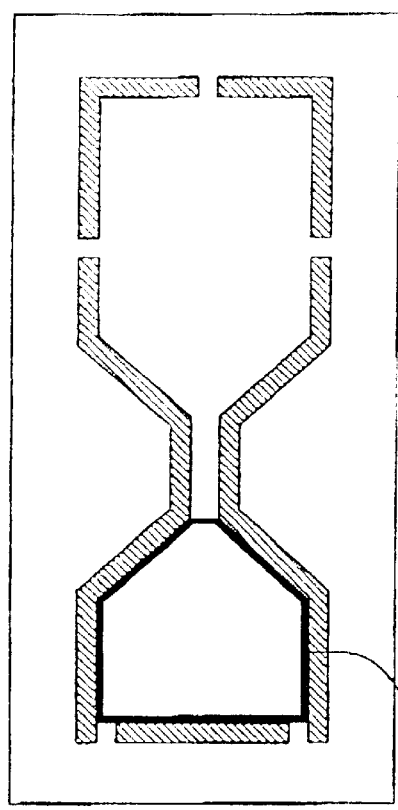
FIG. 1c shows the outer border of a coherent region in the layout.
Figure 1A:
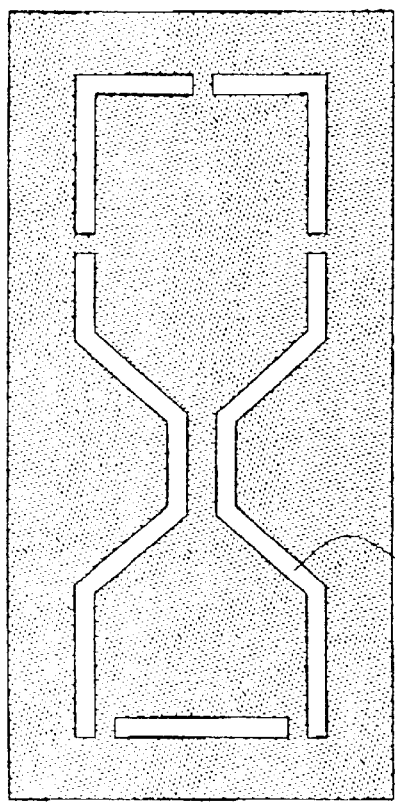
FIG. 1a shows a dark-field mask.

Referring now to the figures of the drawing in detail and first, particularly, to FIGS. 1a to 12 thereof, the first part of the invention—the detection of phase conflicts—will be explained.

In FIGS. 1a–1c and 2a–2d, the differences between known methods for detecting phase conflicts (FIGS. 2a–2d) and the method according to the invention (FIGS. 1a–c) will be illustrated with reference to one and the same dark-field mask structure.

A dark-field mask 10 has transparent regions 1 which are to be imaged onto electrical circuit elements such as conductor tracks or the like.

Figure 2A:
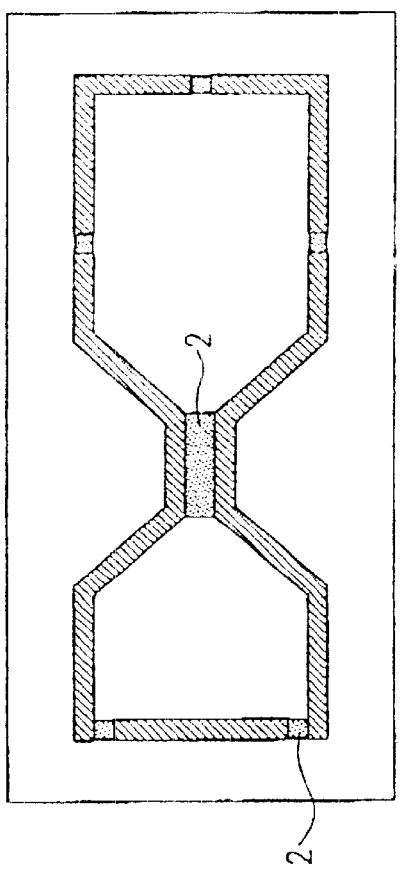
Figure 2B:
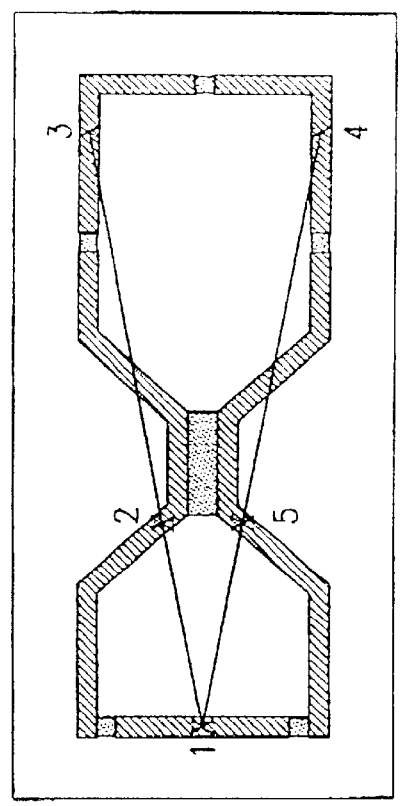
FIG. 2b shows the critical regions determined by means of the layout.

In FIG. 2b, the transparent regions are represented as a hatched polygon. Between the individual sections of the polygon there are critical regions 2 in which the distance between individual sections of the polygon is less than a predefined minimum value. The object is to assign to the individual sections of the polygon the phases which have a phase difference $\Delta\phi=180$.

Figure 2C:
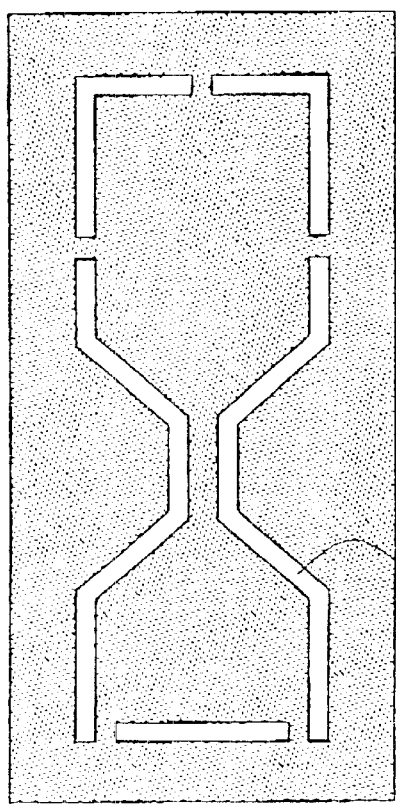
FIG. 2c shows the results obtained with the method known from U.S. Pat. No. 5,923,566.
Figure 2D:
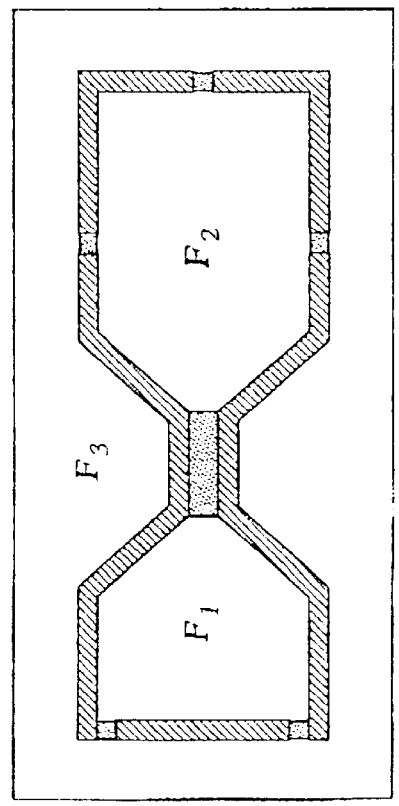
FIG. 2d shows the results obtained with the method known from U.S. Pat. No. 5,537,648.

On the basis of FIG. 2b, the method according to U.S. Pat. No. 5,923,566 leads to the definition of free spaces $F_1$, $F_2$ and $F_3$, as illustrated in FIG. 2c. The free spaces $F_1$ and $F_3$ indicate here the same elementary phase conflict determined by $F_1$. $F_3$ is composed of $F_1$ and $F_2$, in which case $F_2$ does not represent a phase conflict, because of its even number of interactions (4). The same phase conflict is therefore unnecessarily indicated twice.

The method described in Moniwa et al., which was mentioned earlier, is illustrated in FIG. 2d and supplies the three cycles (1251), (123451) and (23452). Of these cycles, only the two first mentioned ones have an uneven number of nodes and correspondingly represent two phase conflicts. The second cycle mentioned is composed of the two other elementary cycles. Because the third cycle has an even number of nodes, there is in reality only one phase conflict which is determined by the first elementary cycle and is unnecessarily indicated twice with the same cycle.

Figure 1B:
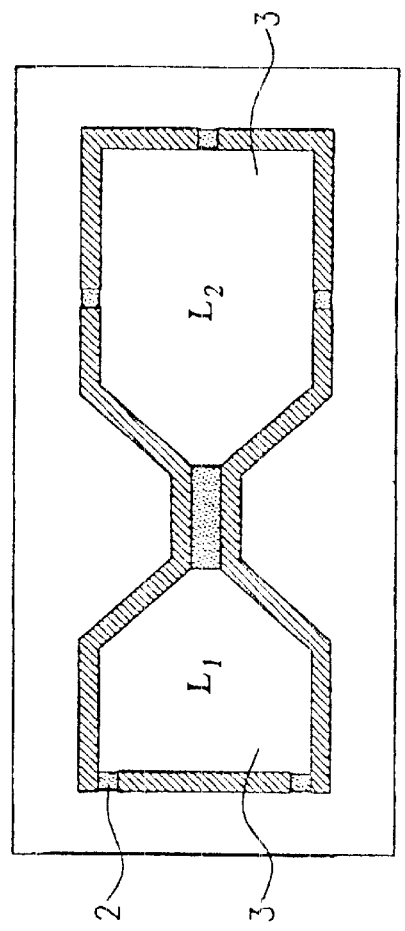
FIG. 1b shows critical regions determined by means of the layout.

In contrast, in the method according to the invention, after the critical regions 2 have been determined, coherent regions 3 which lie outside the transparent and critical regions 1 and 2 and which are designated in FIG. 1b as areas L1 and L2 are determined. These areas are subsequently also referred to as lands. The outer borders 4 of these lands are determined and their interactions or lines of contact with the critical regions 2 are determined. As is shown in FIG. 1c, the outer border of the land L1 represents the single expected phase conflict in an efficient and unambiguous way. The localized phase conflict is indicated visually by means of the outer border 4 illustrated as a polygon in FIG. 1c. On the other hand, the outer border around the land $L_2$ indicates that there is no phase conflict because the number of lines of contact with critical regions 2 is even (4).

Figure 3A:
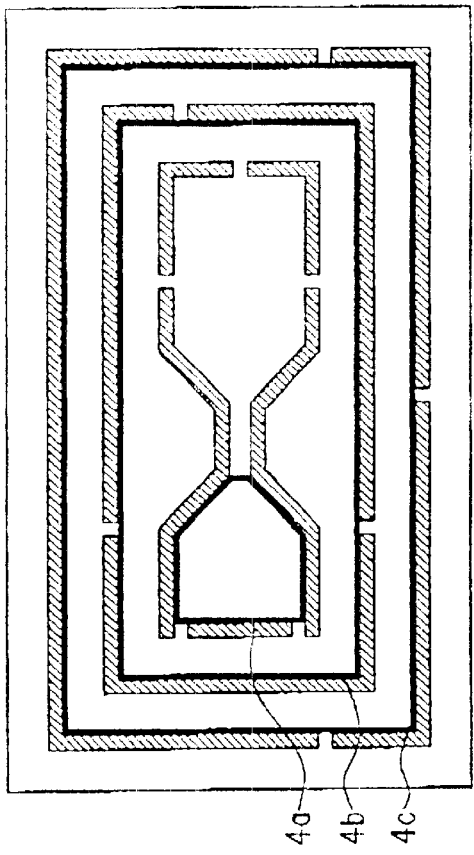
FIG. 3a shows a further dark-field mask.
Figure 3B:
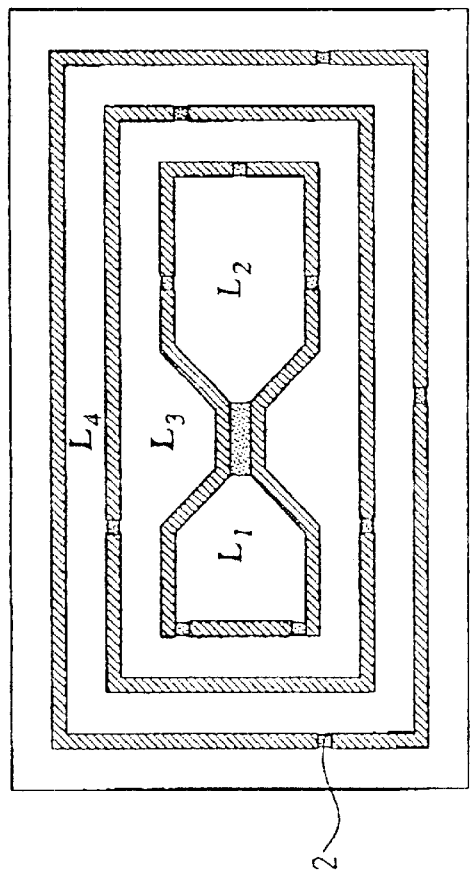
FIG. 3b shows the critical regions which are determined by means of the layout of the dark-field mask.
Figure 3C:
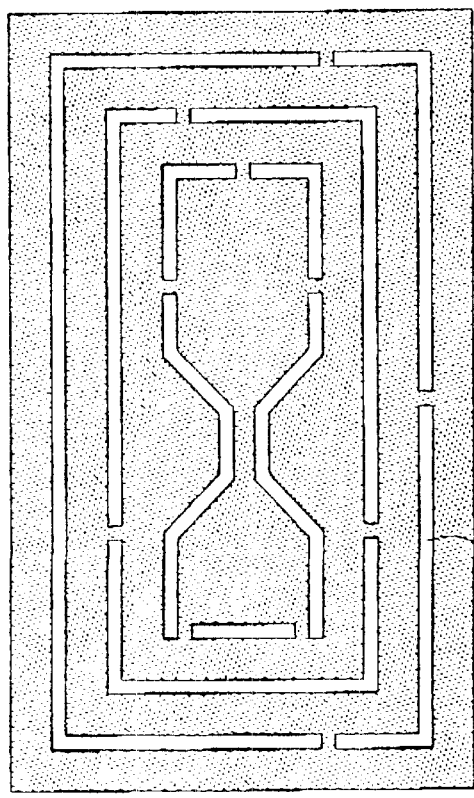
FIG. 3c shows the outer borders of the coherent regions.
Figure 4:
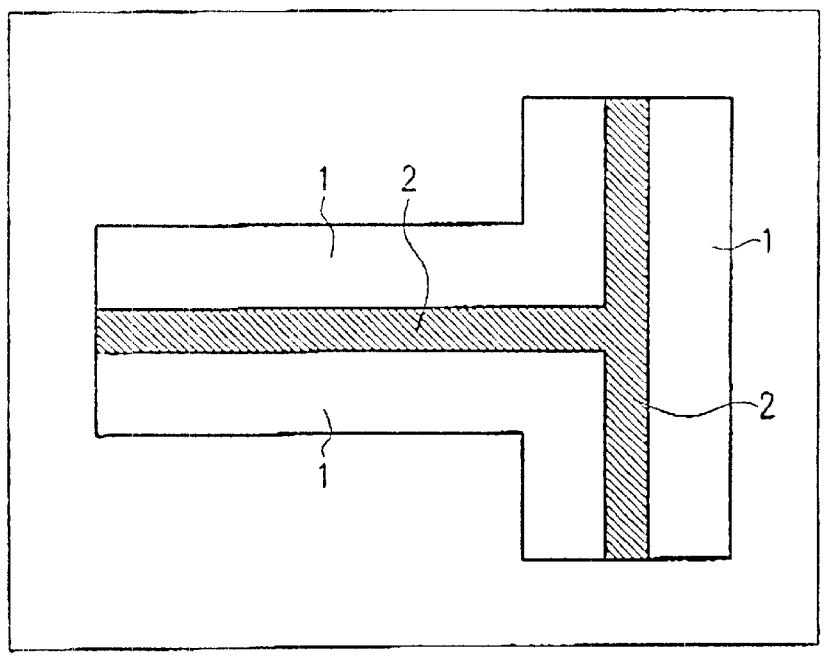
FIG. 4a shows a further dark-field mask with straight sections which meet one another and extend in different directions.
FIG. 4b shows an illustrated overlapping region between the straight sections.
FIG. 4c shows an enlarged circular detail from FIG. 4b with a border around an overlapping region that indicates a phase conflict.
Figure 4:
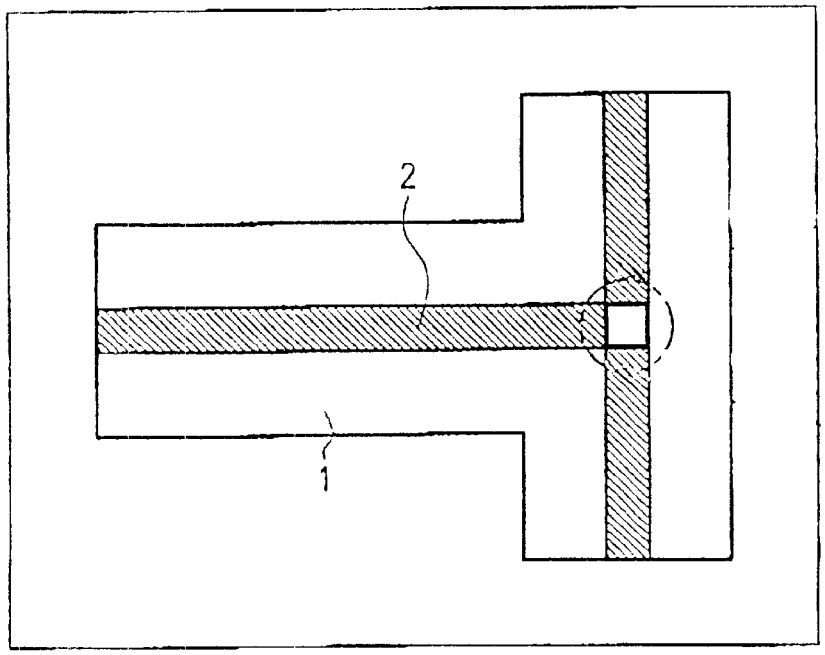
Figure 4:
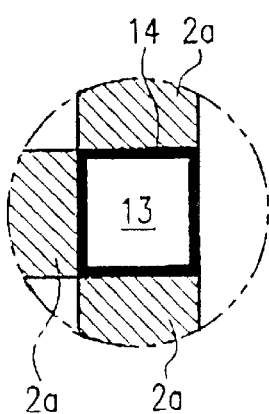
Figure 5:
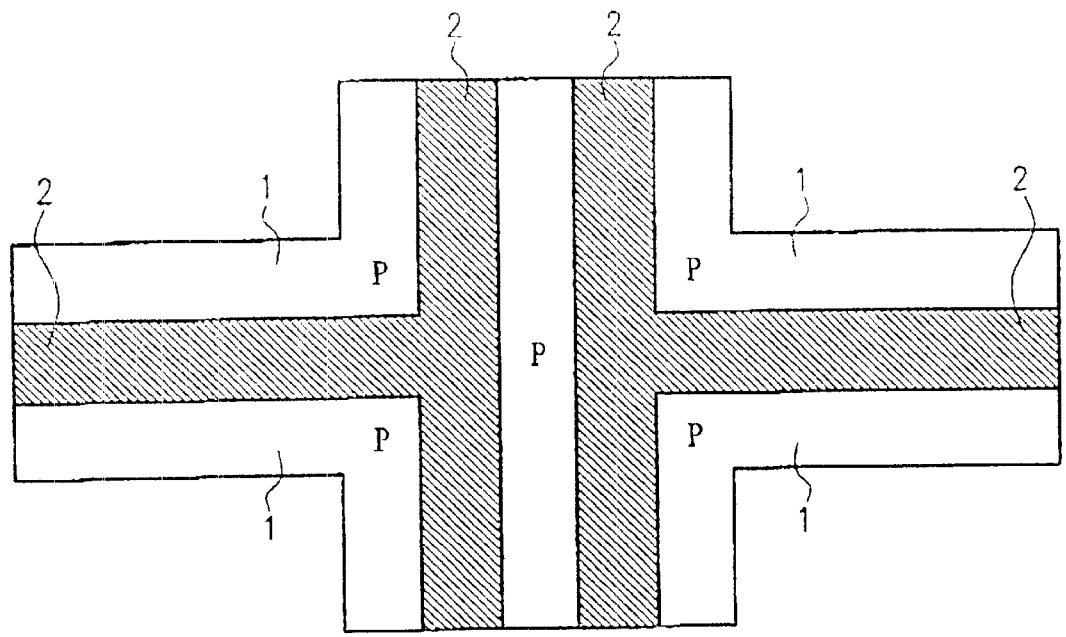
Figure 5:
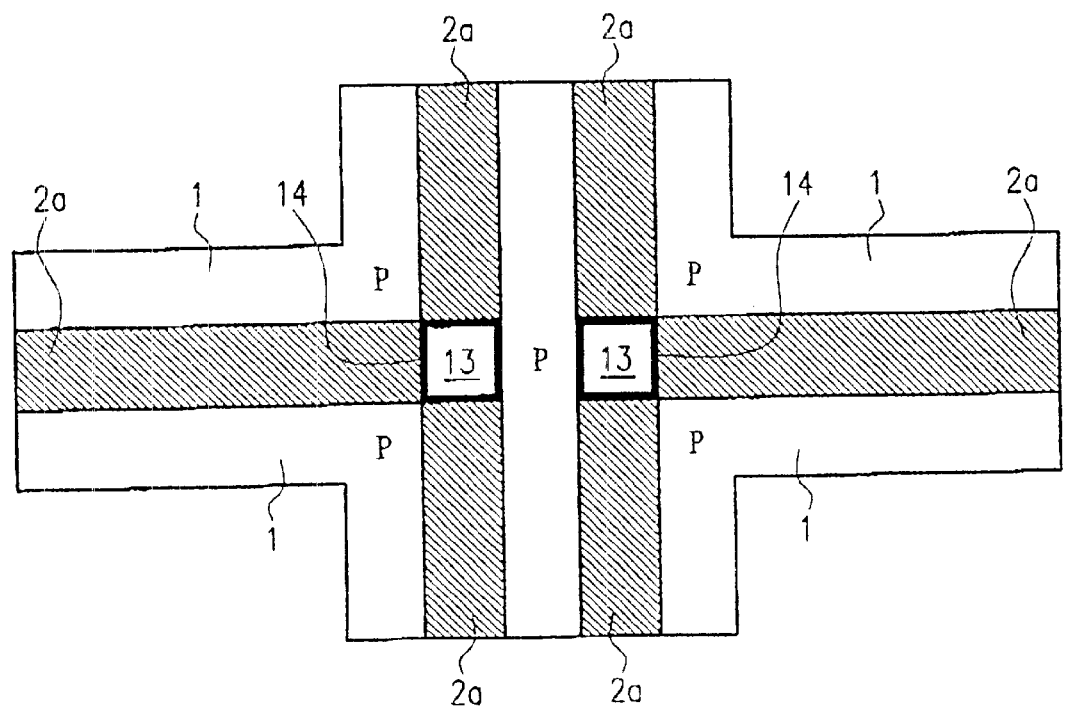

FIGS. 3a–3c show a more complex dark-field mask 100 with which the inadequacy of the method described in U.S. Pat. No. 5,923,566 in comparison with the present invention is illustrated. Firstly, according to FIG. 3b the transparent regions 1 are illustrated in the form of polygons and critical regions 2 between them are determined. Then, the lands L1 to $L_4$ are defined as illustrated. According to FIG. 3c, those outer contours 4a, 4b and 4c of the lands which have an uneven number of lines of contact with critical regions 2 indicate the localized phase conflicts. In the present case, the phase conflict, which is localized by the outer borders of $L_3$, is not registered with the method in U.S. Pat. No. 5,923,566. The reason for this is that this complex phase conflict is restricted by two free spaces, namely the lands $L_3$ and $L_4$ with even numbers of interactions 8 and 6, respectively. This example therefore shows the reliability of the method according to the invention in comparison with the method U.S. Pat. No. 5,923,566 in terms of dark-field masks.

The dark-field masks described above are shaped in such a way that the critical regions are rectangular, or more generally trapezoidal sections of different lengths which extend in one direction. However, it is also possible that two or more such trapezoidal, straight sections which extend in different directions will meet. In this case, not only are lands determined, but also overlapping regions between these trapezoidal, straight sections. An example of such a phase mask is illustrated in FIGS. 4a–4c. On this phase mask 10, three transparent regions 1 are arranged with respect to one another in such a way that critical regions 2 are produced within which the transparent regions 1 are less than a predefined minimum distance apart from one another. The critical regions 2 form a T-shaped structure in which, therefore, two rectangular, straight sections run toward one another and form an overlapping region 13 (See FIG. 4c which shows an enlarged view of the overlapping region 13). The overlapping region 13 is determined by virtue of the fact that the intersecting, straight sections are drawn beyond the points at which they meet, the amount of intersection of the continuing lines which are drawn defining the overlapping region 13. In order to determine the degenerated critical region, the overlapping region 13 is removed from the critical region 2. The outer border 14 around the overlapping region 13 thus has three lines of contact with the three degenerated critical regions 2a and thus signals a phase conflict on the basis of the uneven number of contact lines.

A further dark-field mask structure, which exhibits a dual T structure (2T structure) in comparison with the single T structure shown in FIGS. 4a–4c is illustrated in FIG. 5a. According to FIG. 5b., two overlapping regions 13 are determined and these are removed from the critical, non-transparent regions 2, resulting in the degenerated critical regions 2a. The outer borders 14 around the overlapping regions 13 each have three lines of contact with end sections of straight, degenerated critical regions 2a so that as a result two phase conflicts are indicated. This dual phase conflict cannot be registered with the method in the U.S. Pat. No. 5,923,566 already mentioned.

There are no such overlapping regions 13 in the dark-field masks in FIGS. 1 to 3. As a result, in these cases the critical regions are identical to the degenerated critical regions.

In FIGS. 6a and 6b, a further dark-field mask is illustrated which contains a further type of region which includes a phase conflict. FIG. 6a firstly illustrates the dark-field mask structure which has a coherent transparent region 1 which illustrates, for example, a conductor track structure which is to be imaged by the phase mask and which is surrounded by a non-transparent region. The transparent region 1 is shaped in such a way that it encloses a critical, non-transparent region 2 between two line sections, the non-transparent region 2 being less than a predefined structural size. This critical region 2 thus ends in the middle of a region composed of the transparent region 1. In this case, it is referred to as an end region 13a which is to be generated. The end region 13a is generated by virtue of the fact that a boundary line or outer border 14 is drawn around the end region 13a in such a way that it makes contact with the short side edge of the end section of the critical region 2. Then, as mentioned, degenerated critical regions 2a are again generated by removing possibly present overlapping regions 13 from the critical regions 2. Because the critical region 2 does not contain an overlapping region 13 in the present case, a degenerated critical region 2a (hatched) is generated from it without modification. The outer border 14 thus has a line of contact with the degenerated critical region 2a so that because of the uneven number of contact lines it indicates a phase conflict.

Figure 6:
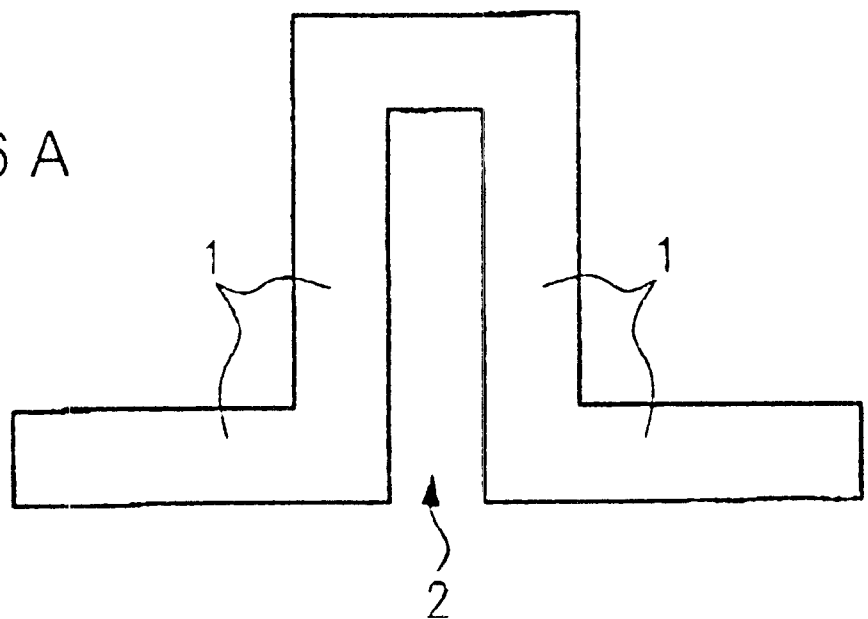
FIG. 6a shows a further dark-field mask having an end region.
FIG. 6b shows the dark-field mask with the critical region (hatched) and the bordering around the edge region.
Figure 6:
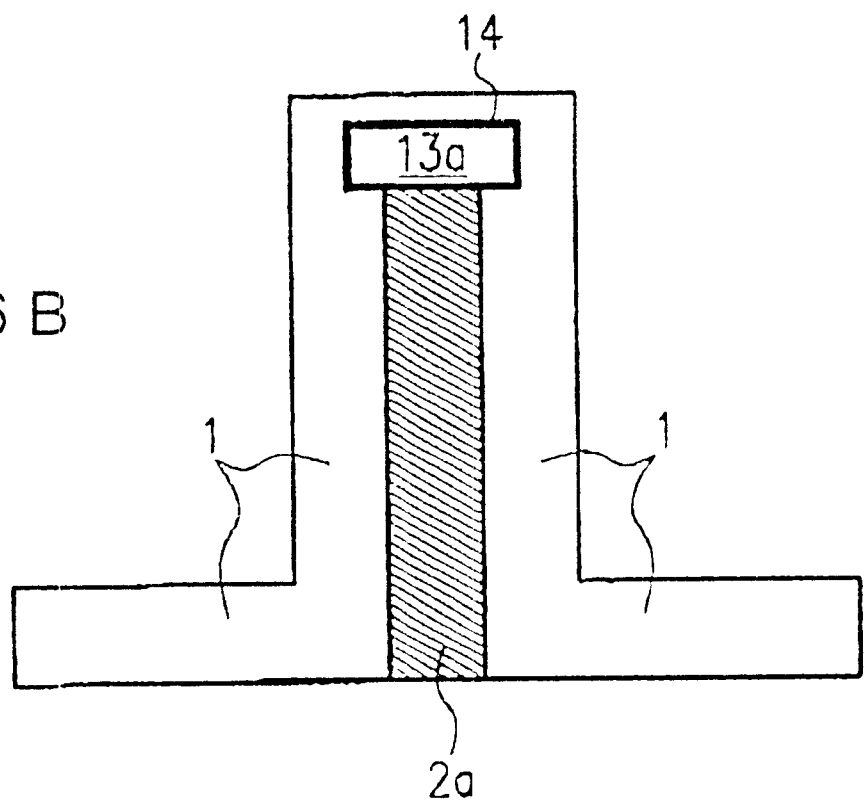

In the text which follows, exemplary embodiments according to a second aspect of the method according to the invention relating to the application on bright-field masks are illustrated. FIG. 7a illustrates a simple exemplary embodiment for a bright-field mask structure 20, which contains non-transparent regions 21 against a transparent background. According to FIG. 7b, phase-shifting elements 22 (illustrated by hatching) are first defined on each side of the non-transparent critical regions 21. Critical regions 21 are considered to be regions which are less than a specific predefined minimum width or minimum structural size. The definition of these phase-shifting elements can be made, for example, as in U.S Pat. No. 5,537,648 (FIG. 6 and associated descriptive text). U.S Pat. No. 5,537,648 is incorporated herein by reference. Then, according to FIG. 7c, overlapping regions 23 are defined between straight sections of the critical regions 21 in the same way as already described in conjunction with the dark-field mask in FIG. 5. By removing the overlapping regions 23 from the critical regions 21, degenerated critical regions 21a are generated. Large outer borders 24 with the overlapping regions 23 and lands are then generated, as shown in FIG. 7e, which is an enlarged view of the circular detail in FIG. 7d. A phase conflict is present precisely when an outer border 24 has an uneven number of interactions or lines of contact with degenerated critical regions 21a. According to FIG. 7e, the outer border 24 around the overlapping region 23 is in contact with the three degenerated critical regions 21a and thus unambiguously signals a T phase conflict.

This phase conflict is not registered by the method according to U.S Pat. No. 5,537,648, and this is because, when the non-directional conflict graph is applied, no cycle is produced because, specifically, only two phase-shifting elements and one coherent critical structure are present.

Figure 7D:
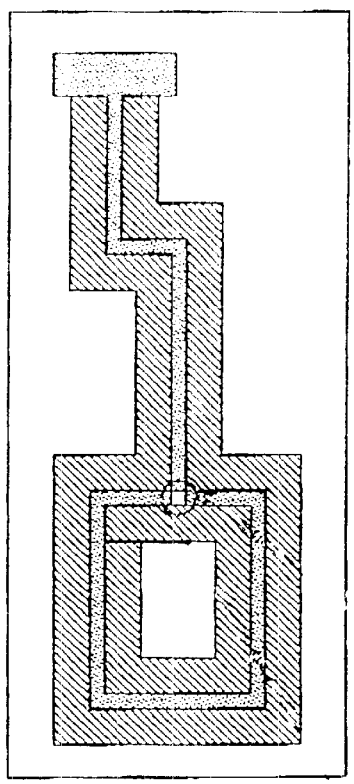
FIG. 7d shows additionally illustrated outer borders around coherent regions or overlapping regions by means of which phase conflicts are manifested.
Figure 7C:
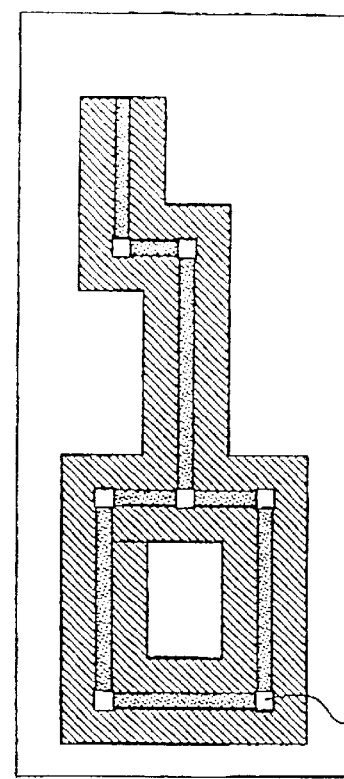
FIG. 7c shows additionally illustrated overlapping regions between the straight sections of the non-transparent, critical structural regions of the mask.
Figure 7E:
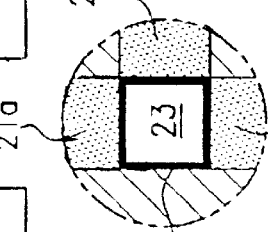
FIG. 7e shows an enlarged circular detail from FIG. 7d with an outer border around an overlapping region that indicates a phase conflict.
Figure 7A:
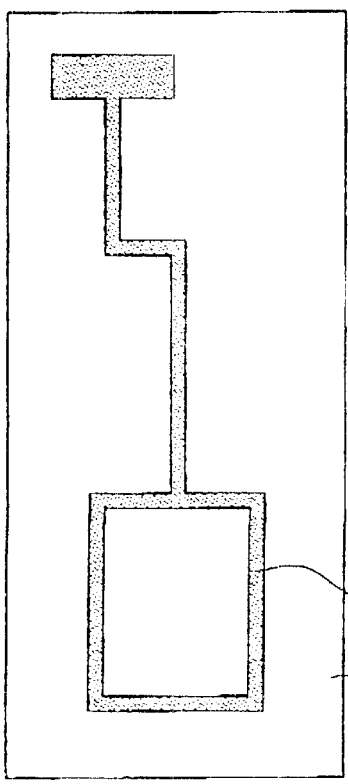
FIG. 7a shows a bright-field mask.
Figure 7B:
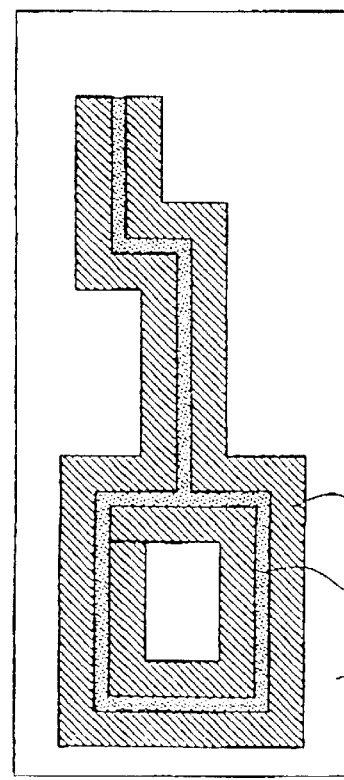
FIG. 7b shows additionally illustrated phase-shifting elements around the non-transparent, critical structural regions of the mask.

FIG. 7c shows that overlapping regions 23 are also regions at which only two straight sections of the non-transparent regions 21, which run in different directions, meet one another, in particular, therefore, buckling points of the circuit element, such as a conductor track, to be imaged. In order to determine the degenerated critical regions 21a, they are also removed from the critical regions 21. However, they generally do not represent phase conflicts because the outer borders associated with them have lines of contact with only two degenerated critical regions 21a, that is to say an even number of degenerated critical regions 21a. In general terms, there are phase conflicts at branching structures such as T branches, from which at least three straight sections start and extend in different directions.

FIGS. 8 to 11 show the mode of operation of the method according to the invention in accordance with its second aspect by means of a relatively complex bright-field mask structure.

Figure 8:
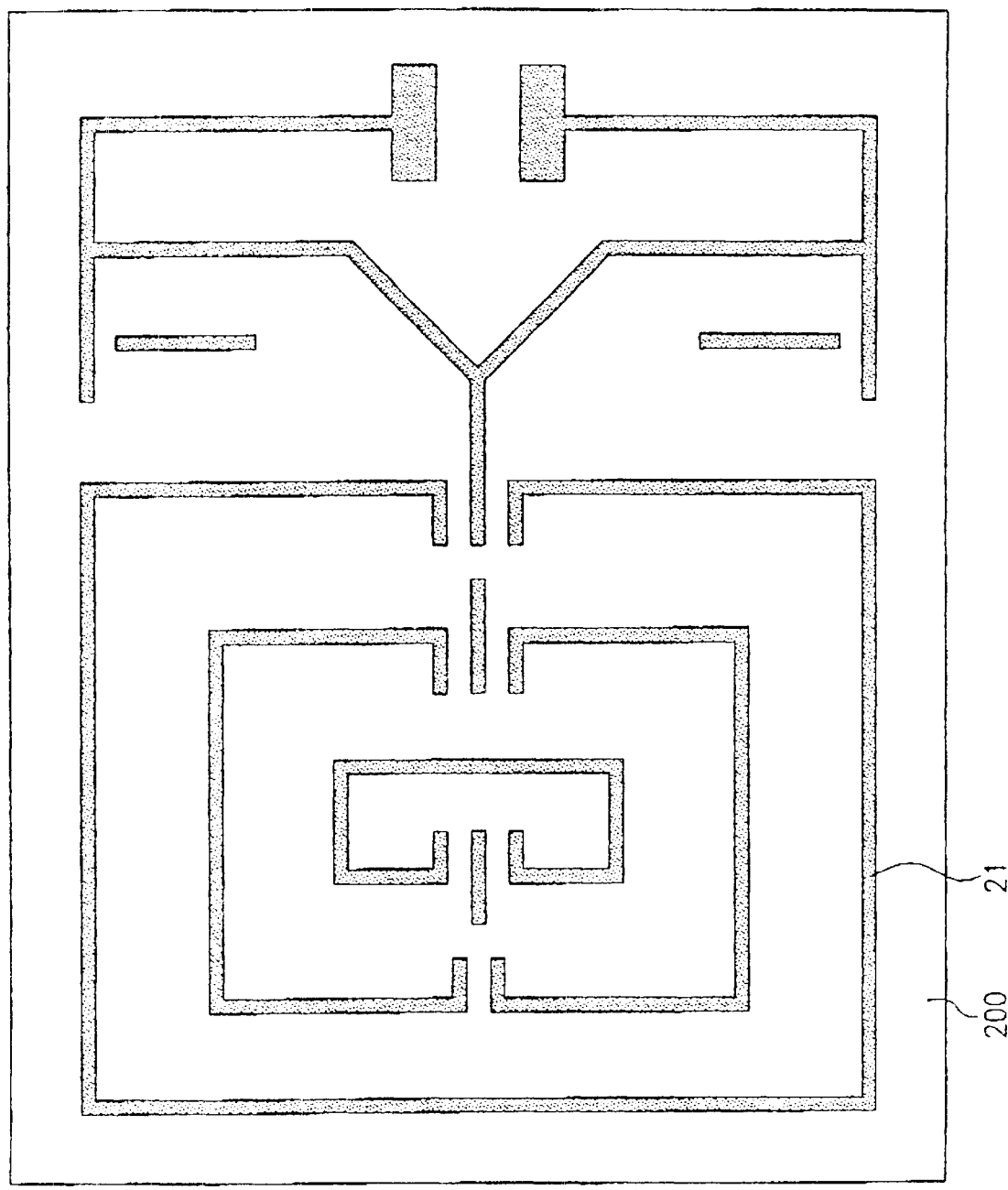
FIG. 8 shows a further example of a bright-field mask structure to be treated according to the invention.

FIG. 8 first illustrates a bright-field mask 200 with non-transparent regions 21, which are to be imaged onto circuit elements such as printed circuit boards or the like. According to FIG. 9, phase-shifting elements 22 (hatched polygons) are determined—as already explained—on each side of the straight sections of the non-transparent regions 21 because the non-transparent regions 21 can be classified as critical.

In this bright-field mask 200, two further types of end region 23a and 23b occur in addition to the lands and the overlapping regions 23, as in dark-field masks. Whenever straight sections of the non-transparent regions 21 end within a phase-shifting element 22, an end region 23a is to be generated. This is simply generated by drawing a boundary line of the end region 23a—as shown in the circular section of FIG. 10b, which is an enlarged view from FIG. 10a,—in such a way that it makes contact with the short side edge of the end section of the non-transparent region 21. In addition, as is apparent from the circular detail in FIG. 10c, which is an enlarged view from FIG. 10a, an end region 23b is generated at the point where a critical region 21 ends at a critical interaction region. Critical interaction regions are regions between phase-shifting elements 22 in which the phase-shifting elements 22 are less than a predefined distance apart. The end region 23b is generated by virtue of the fact that a boundary line of the end region 23b is drawn in such a way that it makes contact with the short side edge of the end section of the critical region 21 at the interaction zone.

In the center of the right-hand half of the diagram in FIG. 10a, a further triangular branching structure which indicates a phase conflict and in which three straight non-transparent sections meet is illustrated. At the meeting point, a triangular overlapping region is formed whose outer border has lines of contact with the end edges of the three straight degenerated critical regions, and thus represents a phase conflict.

Figure 11:
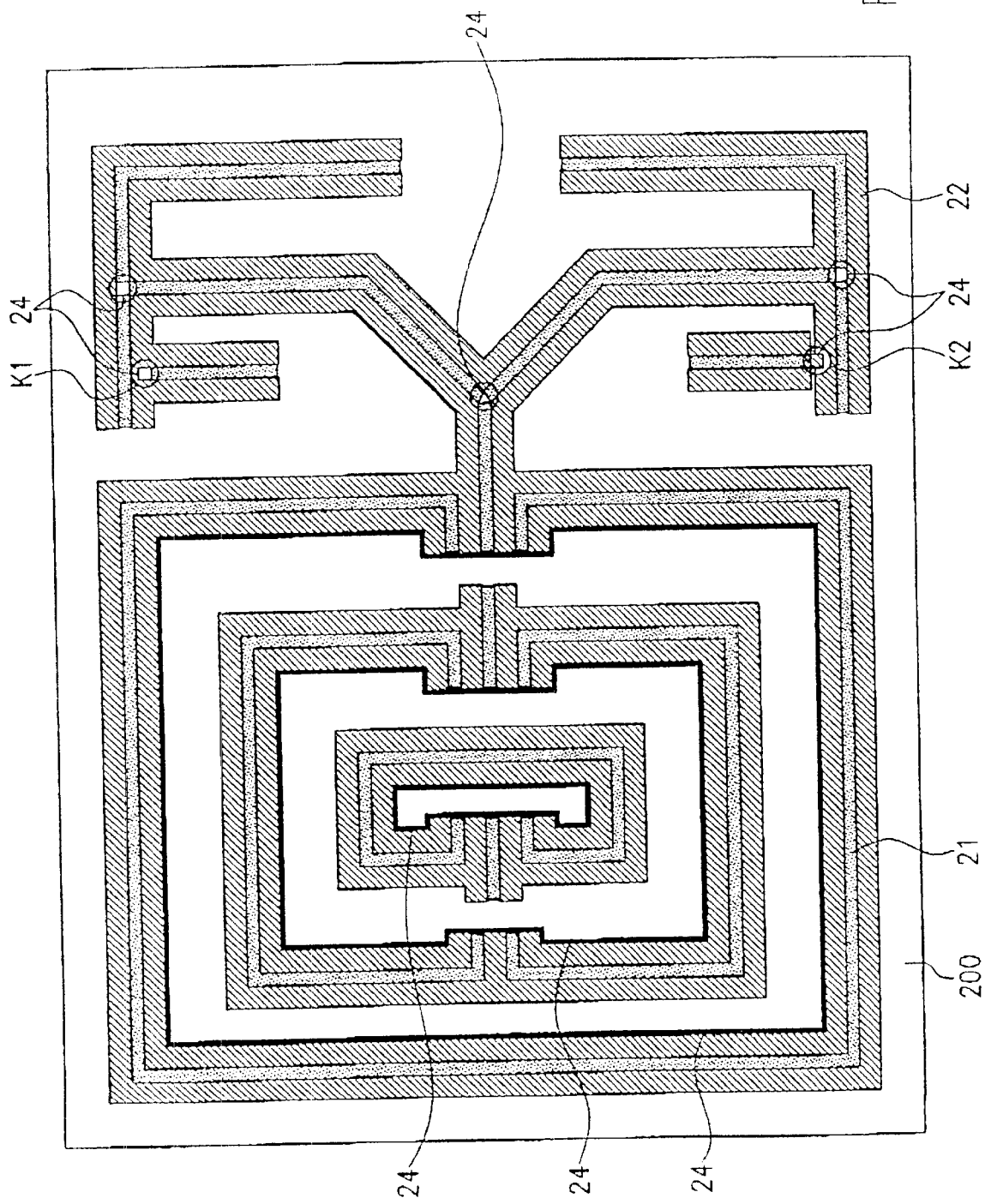
FIG. 11 shows the bright-field mask from FIG. 9 with additionally illustrated outer borders around coherent regions and overlapping regions.

According to FIG. 11, overlapping regions 23 are therefore determined between straight sections of the non-transparent regions 21 and end regions 23a, b of straight sections which end in the middle of a phase-shifting element 22 or an interaction region. Degenerated critical regions are then defined by removing the overlapping regions 23 from the non-transparent regions 21. Phase conflicts are indicated according to FIG. 11 by such large outer borders 24 of lands, overlapping regions 23 or end regions 23a, b which enter into contact with an uneven number of end sections of the degenerated critical regions derived from the non-transparent mask fields 21. End regions 23a, b for bright-field masks and end regions 13a for dark-field masks thus always signal a phase conflict because they enter into contact with precisely one end section of the non-transparent region 21. FIG. 11 therefore shows the eight uniquely localized phase conflicts 24 relating to the bright-field mask structure in FIG. 8 because of the eight dark outer borders 24. The second complex phase conflict on the left-hand side of the image cannot be registered with the prior art method because even numbers of the interactions 6 and 4 are assigned to the two free spaces adjoining it. There are thus two types of what are referred to as end region conflicts K1 and K2. An end region conflict occurs precisely if the corresponding line ends within a phase-shifting element 22 (K1) or a critical interaction region between two phase-shifting elements 22 (K2). These two types of end region conflicts are shown in FIG. 11.

Figure 12:
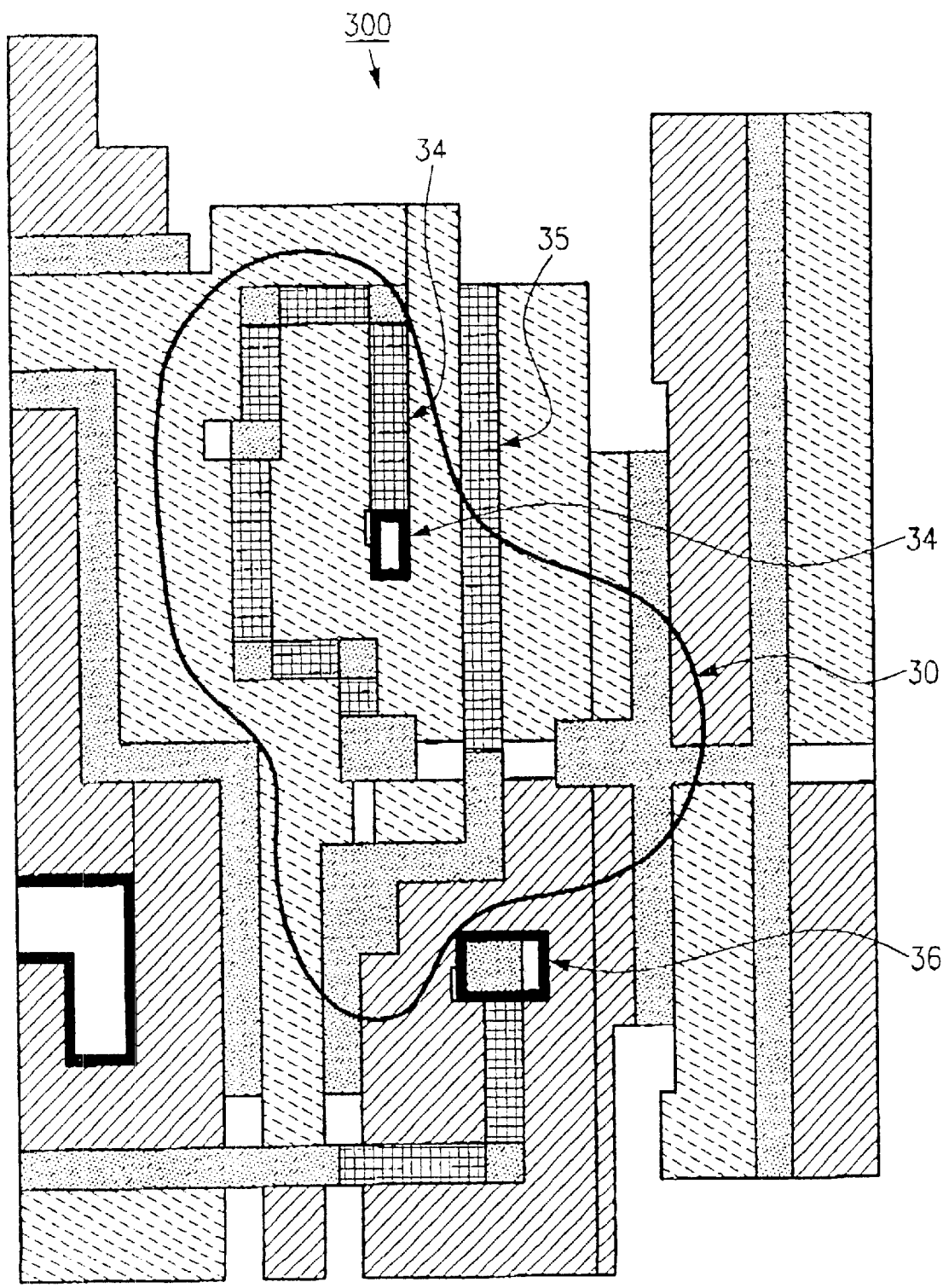
FIG. 12 shows a detail of a gate level to be fabricated with a bright-field phase mask.
Figure 13:
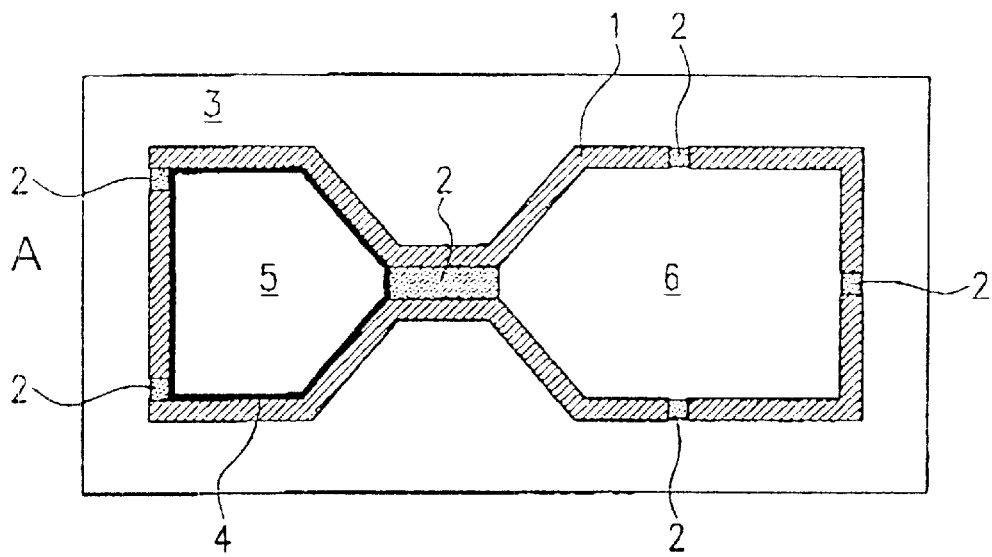
FIGS. 13a–13c show the dark-field phase mask structure of FIG. 2 in order to explain the abovementioned method for eliminating the phase conflicts.
Figure 13:
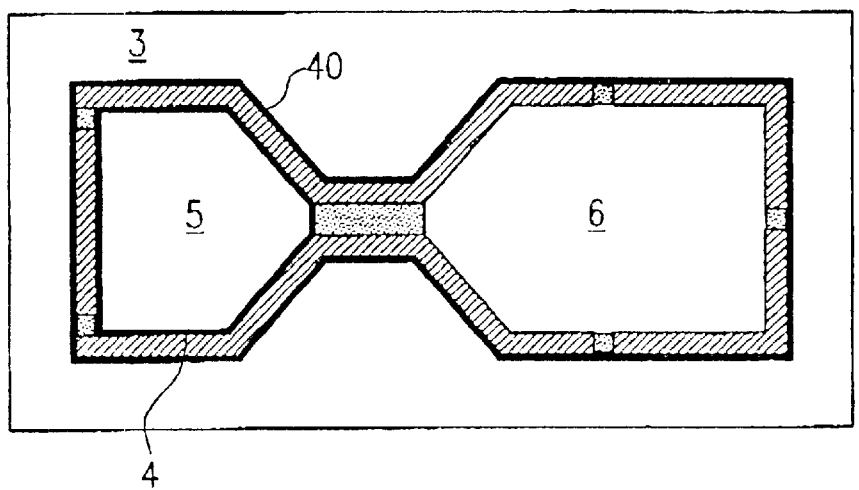
Figure 13:
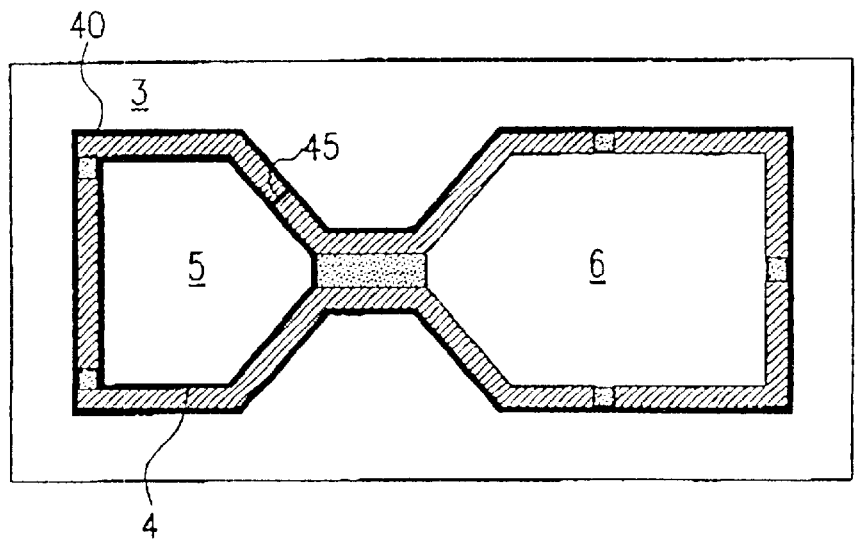

FIG. 12 illustrates a portion of a gate plane that is to be manufactured with a bright-field phase mask. The conductor tracks illustrating a minimum width are critical structures and must therefore be implemented by means of phase elements arranged on each side, while the widened portions (contact pads or landing pads) do not have any critical widths.

On each side of the conductor tracks, generated phase-shifting elements are illustrated which have the two different phases 0° and 180° and are accordingly indicated by two different types of hatching. The parts of conductor tracks (gates in this case), which cannot be imaged directly with the given phase assignment because both sides of the gate are exposed with the same phase, are marked in the manner of a chessboard. In FIG. 12, they are designated as phase conflicts 34 and 35 lying within the border 30. A further phase conflict 36 is present outside the border 30.

The cause of the left-hand one of the two non-localized phase conflicts is the fact that the respective gate adjoins the same phase shifter on both sides. The cause of the right-hand phase conflict is not so easily apparent. The question arises as to why it is not possible to find a phase assignment which avoids this phase conflict. The cause lies in the cycle which the border 30 shows. Along this path, five critical gates and five phase shifters are arranged in a row without gaps. The phase shifters affected by this path cannot be alternately assigned to both phases. This fact is easily apparent from the border 30. However, only the method according to the invention makes it clear that there is actually only one, and not two phase conflicts present in the discussed part of the detail.

The second part of the method according to the invention—the elimination of the phase conflicts detected in the first part—will be explained below by means of exemplary embodiments in FIGS. 13 to 17.

FIG. 13a again shows the layout structure for the dark-field mask according to FIG. 2b. The transparent regions 1 and critical regions 2 which coherently adjoin one another in this structure represent a closed layout group which is surrounded by the lands 3, 5 and 6. In the method according to the invention which is already described, a large outer border 4 which indicates a phase conflict is indicated around a land 5 lying further inward, by virtue of the fact that the large outer border has an uneven number of interaction lines. Then, a region border 40 is drawn around the layout group according to FIG. 13b. The borders 4 and 40 represent polygons whose polygon edges lie partially parallel to one another and opposite one another. According to FIG. 13c, parallel edge pairs lying opposite one another of the border 4 and of the border 40, respectively, are determined first. In FIG. 13c there are five such edge pairs. Connecting paths are generated between the latter and reduced to such a set of connecting paths in which each phase conflict is contained only once. According to FIG. 13c, the connecting paths are thus reduced to an individual connecting path 45. This connecting path 45 has a section which covers the transparent region 1. This section is embodied as a phase limit between two regions of the transparent region 1 whose phase shifts have a phase difference of 180° from one another.

When such a phase mask is exposed, an undesired destructive interference between radiation beams, which have passed through the adjoining phase-shifting regions of the transparent region 1 and interfere with one another, occurs at the phase boundary 45 generated by the connecting path. The resulting non-exposed region must be subsequently exposed by means of a trim mask. This trim mask can advantageously be generated using the connecting path 45 which is obtained as above and which can be embodied, for example, as a transmitting region of a trim mask.

Figure 14:
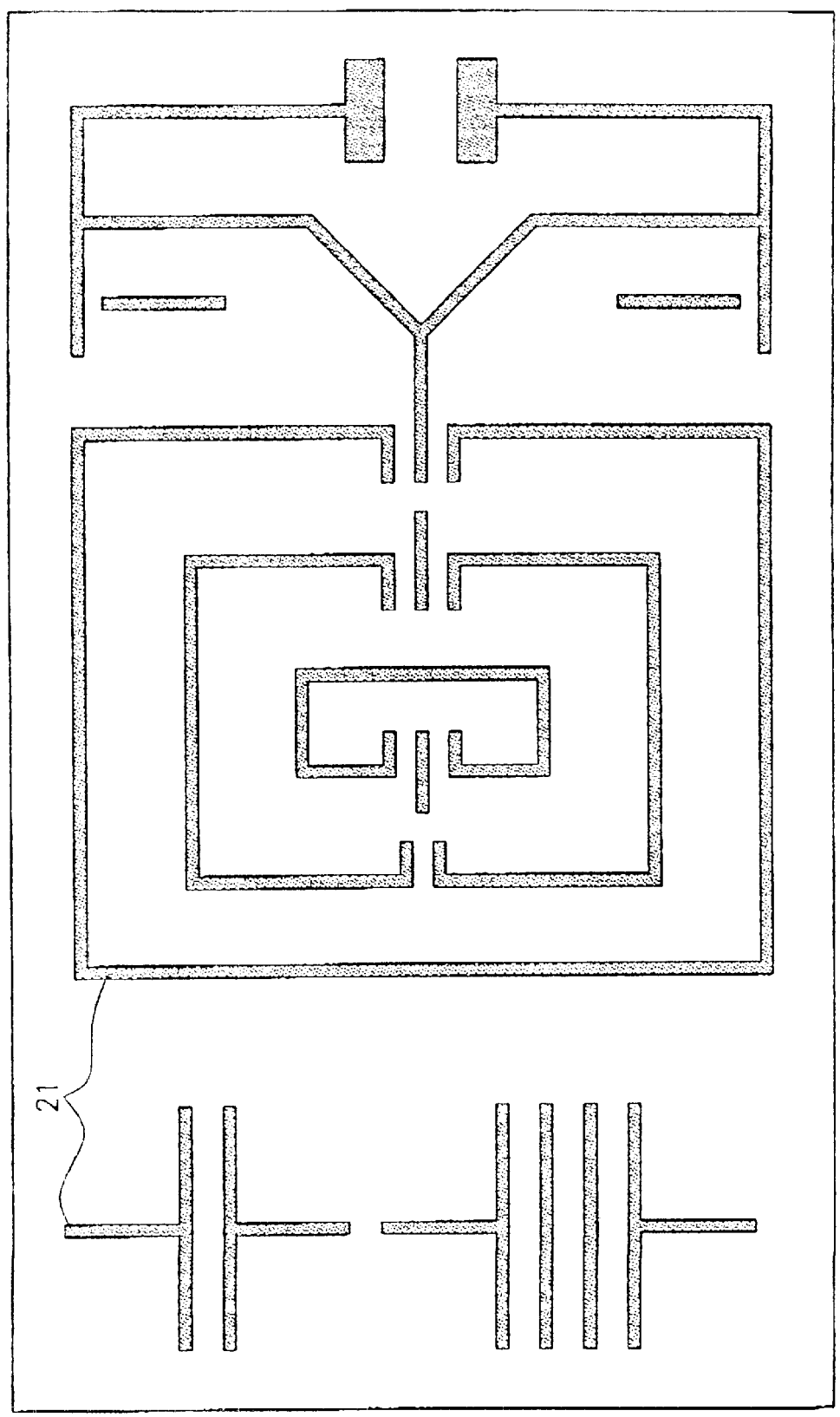
FIG. 14 shows a bright-field phase mask structure in order to explain a method for eliminating the phase conflicts.

FIG. 14 illustrates a layout structure, with reference to which a bright-field mask structure is to be generated. As in FIG. 8, a bright-field mask structure with non-transparent regions 21 (dotted) which are to be imaged onto circuit elements such as conductor tracks or the like is also illustrated in FIG. 14.

Figure 9:
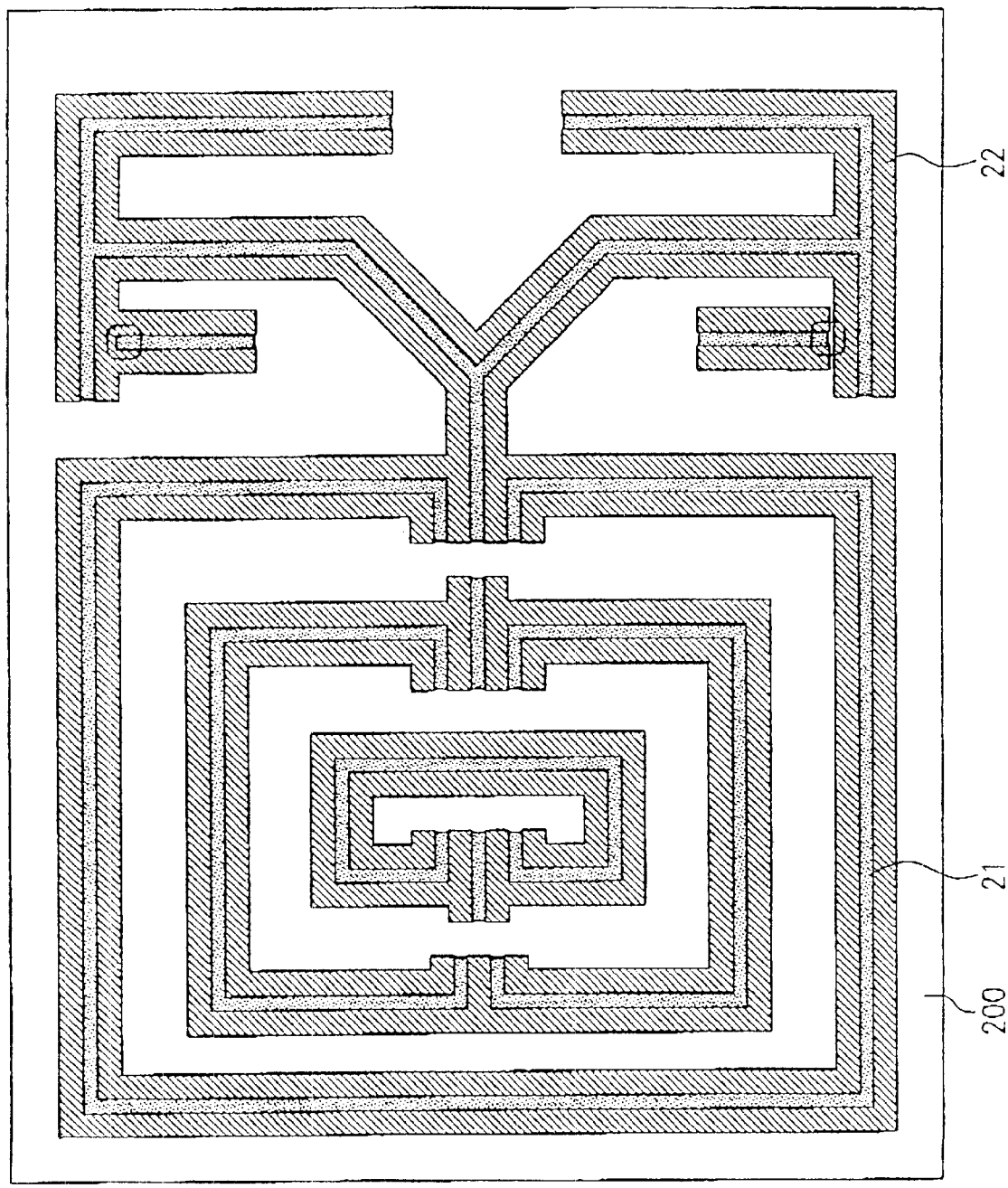
FIG. 9 shows the bright-field mask with additionally illustrated phase-shifting elements around the non-transparent, critical structural regions.
Figure 15:
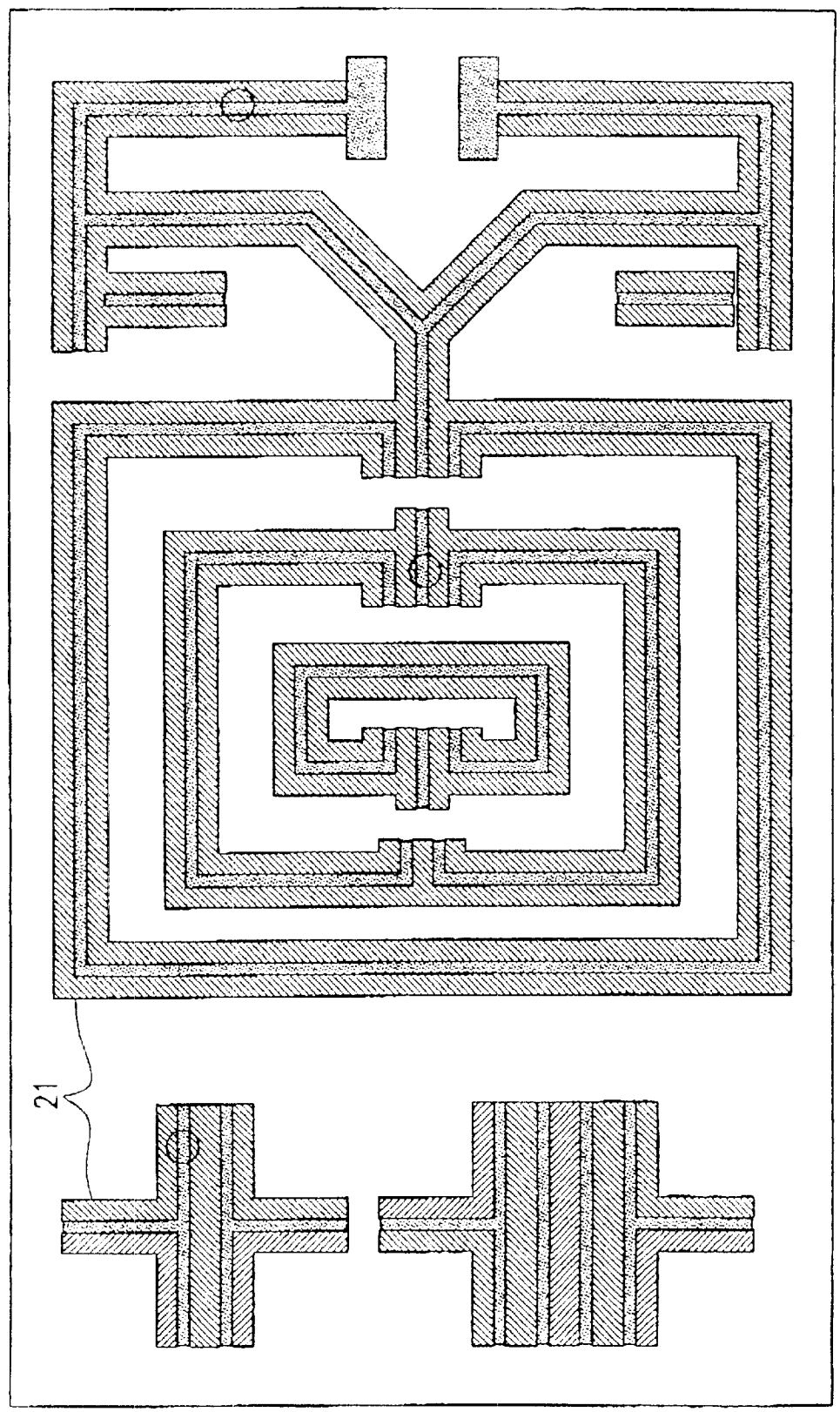
FIG. 15 shows the bright-field phase mask structure in FIG. 14 with additional phase-shifting regions.

According to FIG. 15, phase-shifting elements 22 (hatched) are determined—as already explained for FIG. 9—on each side of the straight sections of the non-transparent regions 21 because the non-transparent regions 21 are less than a critical structural width. The phase-shifting elements 22 have two types of hatching in FIG. 14, indicating that they have two different phase shifts with a phase difference of 180° with respect to one another. Phase conflicts occur where phase-shifting elements 22 occur with the same phase shift on each side of a non-transparent region. By way of example, three phase conflicts are designated by circles.

Figure 16:
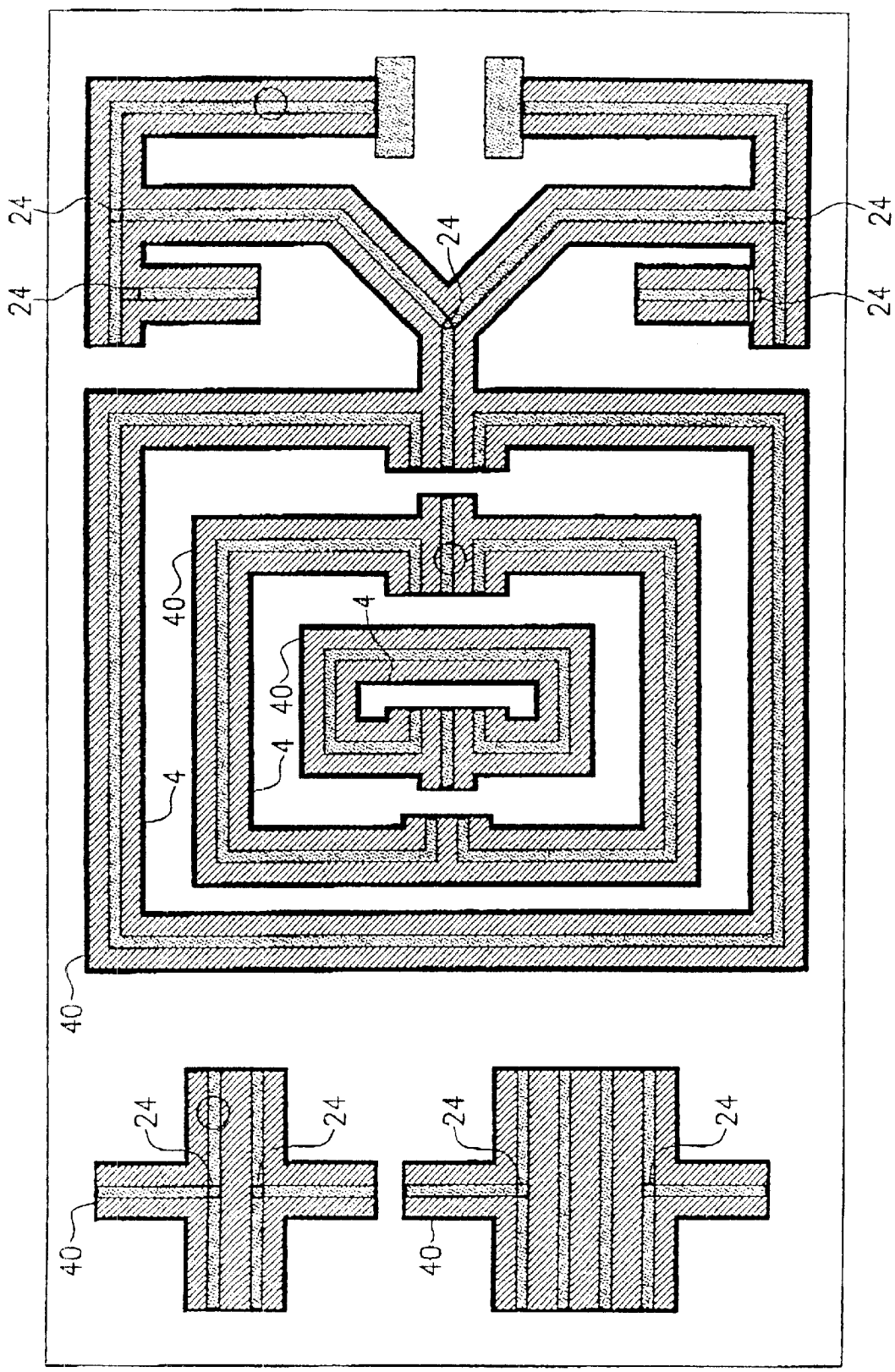
FIG. 16 shows the bright-field phase mask structure in FIG. 15 with additionally illustrated region borders and large outer borders.

In FIG. 16, for the sake of clarity the phase-shifting elements are firstly illustrated with the same type of hatching. In addition, the complete and minimal set of 12 phase conflicts, as determined by means of the method according to the invention, is designated by means of the large outer borders 4 and the outer borders 24 around overlapping regions and end regions.

Furthermore, the layout groups which are coherent in the fashion described are determined and drawn around these region borders 40. Five layout groups or regions are produced which can be identified by means of the five region borders 40 which are illustrated. These layout groups are formed with the inclusion of any interaction regions present. In FIG. 16, there is, for example, an interaction region bottom right, which has already been explained in detail in FIG. 10 in order to explain the end region type 23b, and has been illustrated in enlarged form in FIG. 10c. The end region 23b which is contained in the interaction region, the other end regions 23a, the overlapping regions 23 containing the phase conflicts and lands which form phase conflicts are not part of the layout group.

Then, pairs of edges which lie opposite one another between the phase conflict polygons are determined in the form of their outer borders 4 or 24 and in each case at the next adjacent region borders 40, lying further out, and between the phase conflict polygons 4 and 24, and a connecting path is formed in each case between the edges of each of these pairs.

The set of connecting paths obtained is then reduced to the set in which each phase conflict, i.e. each outer border 4, 24, by means of which a phase conflict is indicated, occurs only once.

Figure 17:
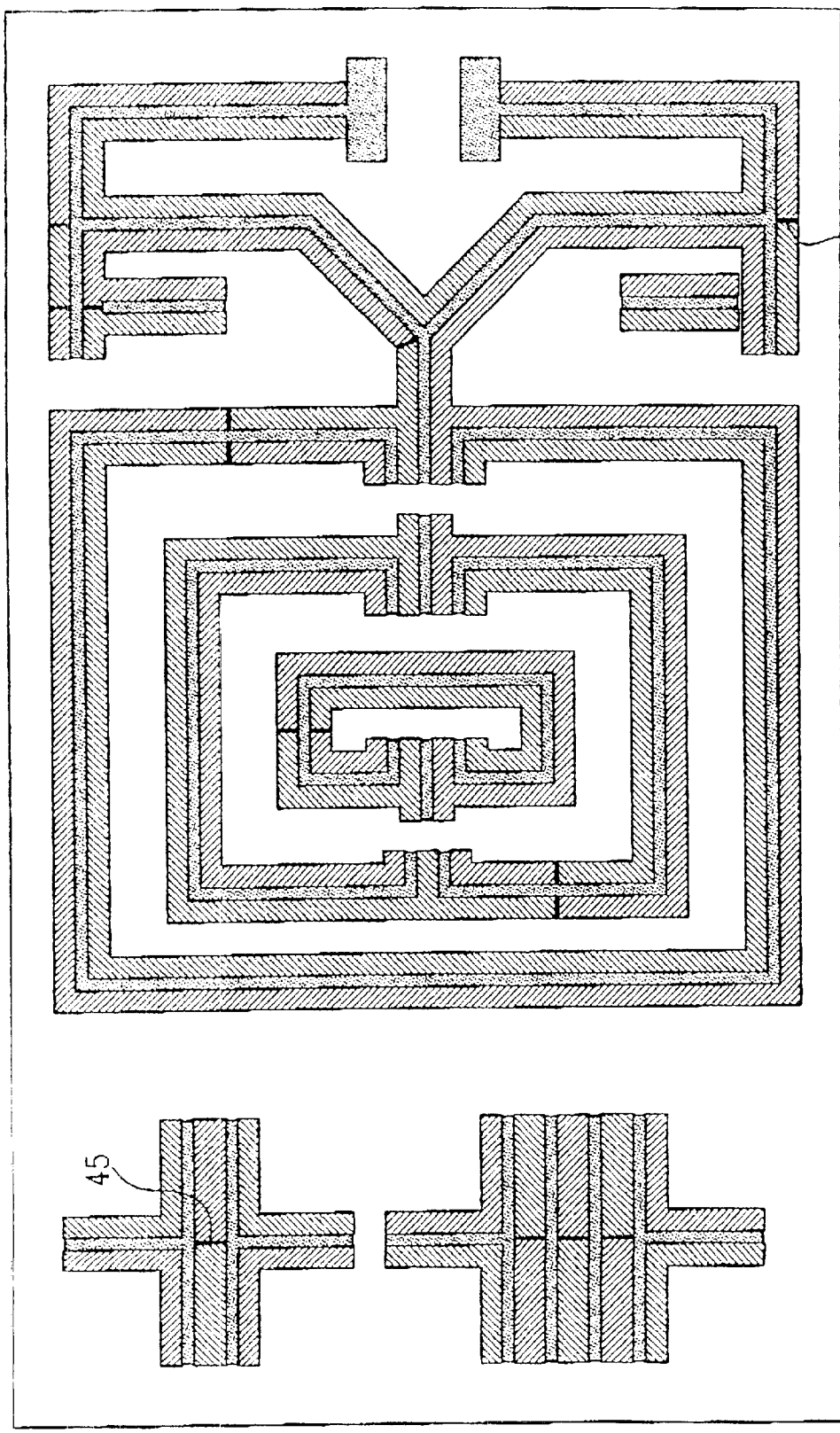
FIG. 17 shows the bright-field phase mask structure in FIG. 16 with the additional connecting path regions (coverage regions) which cover the phase-shifting regions.

FIG. 17 illustrates the two types of phase-shifting elements 22 whose phase shifts have a phase difference of 180° from one another once more with two different types of hatching. In addition, the regions of the connecting paths which run via phase-shifting elements 22 are illustrated as black strokes 45. The connecting paths have already been reduced to the aforesaid set of connecting paths in which each phase conflict, i.e. each outer border 4, 24 occurs only once. The sections 45 of the connecting paths which are obtained in this way and which cover the phase-shifting elements 22 are embodied as phase boundaries within a phase-shifting element 22 by means of which a phase-shifting element 22 is divided into two phase-shifting regions whose phase shifts have a phase difference of 180° from one another.

As is apparent from the triangular branching contained in the center of the right-hand half of FIGS. 14 to 17, and from the associated triangular overlapping region 23 and the triangular outer border 24, it is not always the case that the connecting paths are generated between parallel edges. In the case of such phase conflicts, a connecting path to the layout border 40 lying further out (to a buckling point between two polygon edges in the case shown) is drawn so that it starts merely from the outer border 24.

At the interaction region already mentioned which is bottom right in the figure, a connecting path is generated at the edge of the interaction region and thus at the edge of a phase-shifting region. In this case, this connecting path indicates that the phase-shifting region which is present on the opposite side is to be given a contrasting coloring, or an opposed phase shift—as indicated by the types of hatching.

As in the case of the dark-field mask, destructive interference between radiation beams which pass through the adjoining phase-shifting elements 22 and interfere with one another also occurs here when the phase mask is exposed at the phase boundaries 45. The resulting non-exposed region must be subsequently exposed by means of a trim mask. This trim mask can in turn advantageously be generated using the connecting paths 45 which are obtained as above and can be embodied, for example as transmitting regions of the trim mask.

The precise position of the selected connecting paths and of the phase boundaries 45 defined by them can be selected here within relatively wide limits because in many cases when selecting the minimum set of connecting paths it is also possible to obtain other connecting paths by, for example, selecting a different pair of edges and/or changing the position of the connecting path along the length of the edges which are opposite one another.

We claim:

1. A method for detecting and for automatically eliminating phase conflicts on an alternating phase mask having transparent regions onto which electrical circuit elements are to be imaged, the method which comprises:

determining critical regions in which two adjacent transparent regions that are provided for a phase mask are less than a specific predefined minimum distance from one another;

determining overlapping regions that are between straight sections of the critical regions, determining end regions of straight sections of the critical regions which end in a middle of the transparent regions, and removing the overlapping regions from the critical regions to determine degenerated critical regions;

determining coherent regions that lie outside the transparent regions and the critical regions, and determining outer borders of the coherent regions, outer borders of the overlapping regions and outer borders of the end regions;

determining a number of contact lines between the one of the outer borders of each one of the coherent regions and the degenerated critical regions, determining a number of contact lines between each one of the overlapping regions and the degenerated critical regions, and determining a number of contact lines between each one of the end regions and the degenerated critical regions, and detecting a phase conflict each time a respective one of the number of the contact lines is an even number and thereby defining a number of phase conflicts; and resolving the phase conflicts by:
defining coherent layout regions by the transparent regions and the critical regions that lie between the transparent regions minus the end regions and the overlapping regions which represent the phase conflicts, and defining region borders of the coherent layout regions, obtaining a set of connecting paths by generating at least one connecting path between an outer border that represents a phase conflict and a border selected from the group consisting of a directly adjacent region border that lies further out and an uneven number of large outer borders that are not yet connected and that also represent phase conflicts, reducing the set of connecting paths such that each one of the phase conflicts is contained precisely once, marking regions of the connecting paths that lie over the transparent regions, and forming coverage regions as region boundaries between two different regions of the phase mask that is to be manufactured such that the coverage regions have phase shifts with a phase difference of 180° degrees.

2. The method according to claim 1, wherein the step of obtaining the set of the connecting paths includes forming the connecting paths between pairs of parallel edges, opposite one another, of respective polygons.

3. The method according to claim 1, which comprises manufacturing a trim mask for subsequently exposing the coverage regions.

4. A method for detecting and for automatically eliminating phase conflicts on an alternating phase mask having non-transparent critical regions onto which electrical circuit elements are to be imaged, the method which comprises:

determining phase-shifting regions on each side of non-transparent critical regions that are provided for a phase mask;

determining overlapping regions that are between straight sections of the critical regions, determining end regions of straight sections of the critical regions, determining end regions that end in the middle of regions selected from the group consisting of phase-shifting regions and critical interaction regions that are between phase-shifting regions, and removing the overlapping regions from the critical regions to determine degenerated critical regions;

determining coherent regions that lie outside the phase-shifting regions and the critical regions, determining outer borders of the coherent regions, determining outer borders of the overlapping regions and determining outer borders of the end regions;

determining a number of contact lines between the one of the outer borders of each one of the coherent regions and the degenerated critical regions, determining a number of contact lines between each one of the outer borders of the overlapping regions and the degenerated critical regions, determining a number of contact lines between each one of the outer borders of the end regions and the degenerated critical regions, and detecting a phase conflict each time a respective one of the number of the contact lines is an uneven number and thereby defining a number of phase conflicts; and resolving the phase conflicts by:

defining coherent layout regions by the phase-shifting regions, the critical regions, and the interaction regions lying between them minus the end regions and the overlapping regions which represent phase conflicts, and defining region borders of the coherent layout regions, obtaining a set of connecting paths by generating at least one connecting path between an outer border that represents a phase conflict and a border selected from the group consisting of a directly adjacent region border that lies further out and an uneven number of large outer borders that are not yet connected and that also represent phase conflicts, reducing the set of connecting paths such that each one of the phase conflicts is contained precisely once, marking regions of the connecting paths that lie over the transparent regions, and forming coverage regions as region boundaries between two different regions of the phase mask that is to be manufactured such that the coverage regions have phase shifts with a phase difference of 180° degrees.

5. The method according to claim 4, wherein the step of obtaining the set of the connecting paths includes forming the connecting paths between pairs of parallel edges, opposite one another, of respective polygons.

6. The method according to claim 4, which comprises manufacturing a trim mask for subsequently exposing the coverage regions.

* * * * *